(12) United States Patent
Koo et al.

(10) Patent No.: US 11,653,528 B2
(45) Date of Patent: *May 16, 2023

(54) LIGHT EMITTING DEVICE AND DISPLAY APPARATUS INCLUDING THE SAME

(71) Applicant: SAMSUNG ELECTRONICS CO., LTD., Suwon-si (KR)

(72) Inventors: Hyun Koo, Seongnam-si (KR); Sunjin Song, Seoul (KR); Wonjae Joo, Seongnam-si (KR); Sunghyun Han, Pohang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/112,363

(22) Filed: Dec. 4, 2020

(65) Prior Publication Data
US 2021/0280832 A1 Sep. 9, 2021

(30) Foreign Application Priority Data
Mar. 3, 2020 (KR) ........................ 10-2020-0026796

(51) Int. Cl.
*H10K 50/86* (2023.01)
*H10K 50/17* (2023.01)
(Continued)

(52) U.S. Cl.
CPC ......... *H10K 50/865* (2023.02); *H10K 50/171* (2023.02); *H10K 50/852* (2023.02);
(Continued)

(58) Field of Classification Search
CPC ... H01L 51/5265; H01L 27/3244–3279; H01L 27/3246; H01L 27/3248;
(Continued)

(56) References Cited

U.S. PATENT DOCUMENTS 8,664,655 B2   3/2014 Lee et al.
10,615,372 B2  4/2020 Joo et al.
(Continued)

FOREIGN PATENT DOCUMENTS

EP   3503224 A1   6/2019
EP   3614447 A1   2/2020
(Continued)

OTHER PUBLICATIONS

Communication dated Jul. 23, 2021 issued by the European Patent Office in application No. 21156225.1.

*Primary Examiner* — Jesse Y Miyoshi
(74) *Attorney, Agent, or Firm* — Sughrue Mion, PLLC

(57) ABSTRACT

Provide is a light emitting device including a reflective layer including a phase modulation surface, a planarization layer disposed on the reflective layer, a first electrode disposed on the planarization layer, an organic emission layer disposed on the first electrode and configured to emit visible light that includes light of a first wavelength and light of a second wavelength that is shorter than the first wavelength, and a second electrode disposed on the organic emission layer, wherein the reflective layer and the second electrode form a micro cavity configured to resonate the light of the first wavelength, and wherein the planarization layer includes a light absorber configured to absorb the light of the second wavelength.

18 Claims, 24 Drawing Sheets

(51) Int. Cl.
    *H10K 50/852*   (2023.01)
    *H10K 50/856*   (2023.01)
    *H10K 59/35*    (2023.01)
    *H10K 59/80*    (2023.01)
(52) U.S. Cl.
    CPC ......... *H10K 50/856* (2023.02); *H10K 59/351* (2023.02); *H10K 59/876* (2023.02)
(58) Field of Classification Search
    CPC ............. H01L 27/3251; H01L 27/3253; H01L 27/3255; H10K 50/852; H10K 59/876; H10K 59/12–1315
    See application file for complete search history.

(56) References Cited

U.S. PATENT DOCUMENTS

| | | | |
|---|---|---|---|
| 11,038,148 B2* | 6/2021 | Kyoung | H01L 51/5265 |
| 2009/0212696 A1* | 8/2009 | Terao | H01L 51/5265 313/506 |
| 2010/0001637 A1* | 1/2010 | Satou | H01L 51/5265 313/504 |
| 2010/0052524 A1* | 3/2010 | Kinoshita | H01L 51/5265 313/506 |
| 2013/0181242 A1 | 7/2013 | Cho | |
| 2016/0233275 A1 | 8/2016 | Toyoda | |
| 2018/0211979 A1 | 7/2018 | Lee et al. | |
| 2020/0243800 A1 | 7/2020 | Joo et al. | |
| 2020/0266387 A1* | 8/2020 | Song | H01L 51/5056 |
| 2020/0403037 A1 | 12/2020 | Joo et al. | |
| 2021/0288290 A1 | 9/2021 | Lee et al. | |
| 2021/0296616 A1 | 9/2021 | Song et al. | |

FOREIGN PATENT DOCUMENTS

| | | |
|---|---|---|
| JP | 2016-149191 A | 8/2016 |
| KR | 10-1108167 B1 | 2/2012 |
| KR | 10-2013-0084848 A | 7/2013 |
| KR | 1020180087908 A | 8/2018 |
| KR | 10-2019-0076832 A | 7/2019 |
| KR | 10-2020-0093324 A | 8/2020 |

* cited by examiner

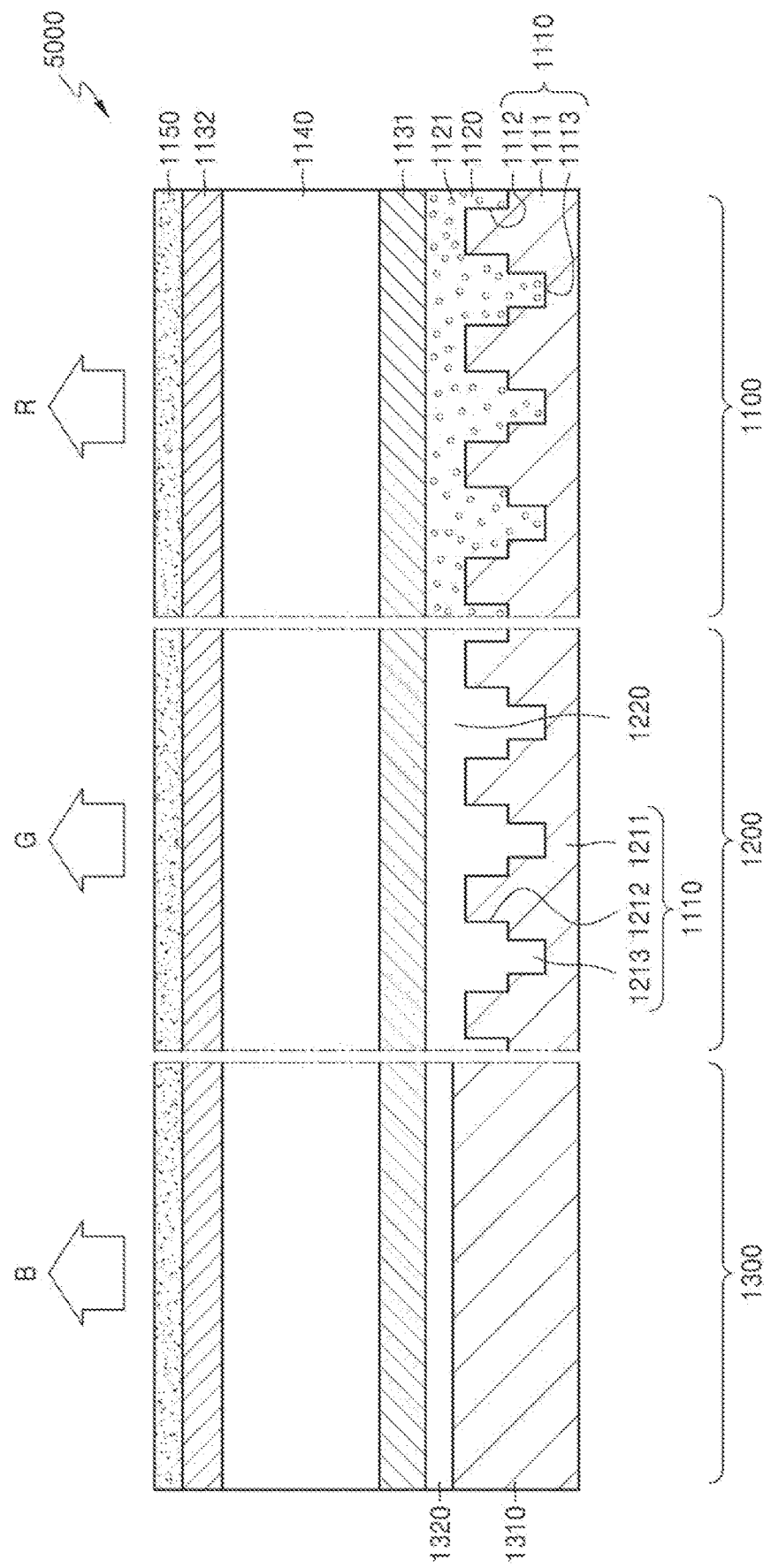

LIGHT EMITTING DEVICE AND DISPLAY APPARATUS INCLUDING THE SAME

CROSS-REFERENCE TO RELATED APPLICATION

This application claims priority to Korean Patent Application No. 10-2020-0026796, filed on Mar. 3, 2020, in the Korean Intellectual Property Office, the disclosure of which is incorporated herein in its entirety by reference.

BACKGROUND

1. Field

Example embodiments of the present disclosure relate to a light emitting device and a display apparatus including the light emitting device, and more particularly to, an organic light emitting device having high color purity without using a color filter and an organic light emitting display apparatus.

2. Description of Related Art

An organic light emitting device (OLED) is a display apparatus that forms an image via light emission according to a combination of holes supplied from an anode and electrons supplied from a cathode in an organic emission layer. The OLED has excellent display characteristics such as a wide viewing angle, a fast response speed, a thin thickness, a low manufacturing cost, and a high contrast.

Further, the OLED may emit a desired color according to selection of an appropriate material as a material of the organic emission layer. According to this principle, it may be possible to manufacture a color display apparatus by using the OLED. For example, an organic emission layer of a blue pixel may include an organic material that generates blue light, an organic emission layer of a green pixel may include an organic material that generates green light, and an organic emission layer of a red pixel may include an organic material that generates red light. Also, a white OLED may be manufactured by arranging a plurality of organic materials which respectively generate blue light, green light, and red light in one organic emission layer or by arranging pairs of two or more types of organic materials in a complementary relationship with each other.

SUMMARY

One or more example embodiments provide a light emitting device and a display apparatus having high color purity without using a color filter by using a planarization layer including a micro cavity having a phase modulation surface and a light absorber.

Additional aspects will be set forth in part in the description which follows and, in part, will be apparent from the description, or may be learned by practice of the example embodiments of the disclosure.

According to an aspect of an example embodiment, there is provide a light emitting device including a reflective layer including a phase modulation surface, a planarization layer disposed on the reflective layer, a first electrode disposed on the planarization layer, an organic emission layer disposed on the first electrode and configured to emit visible light that includes light of a first wavelength and light of a second wavelength that is shorter than the first wavelength, and a second electrode disposed on the organic emission layer, wherein the reflective layer and the second electrode form a micro cavity configured to resonate the light of the first wavelength, and wherein the planarization layer includes a light absorber configured to absorb the light of the second wavelength.

The phase modulating surface of the reflective layer may include a plurality of protrusions that are periodically two-dimensionally formed, and a resonance wavelength of the micro cavity may be determined based on a width or a diameter of each of the plurality of protrusions, a height of each of the plurality of protrusions, and distances between the plurality of protrusions.

When the first wavelength is $\lambda$, the width or the diameter of each of the plurality of protrusions, the height of each of the plurality of protrusions, and the distances between the plurality of protrusions may be set such that an optical length of the micro cavity is equal to $n\lambda/2$, where n is a natural number.

The phase modulating surface of the reflective layer may further include a plurality of recesses that are periodically two-dimensionally formed.

The plurality of recesses may be configured to absorb the light of the second wavelength.

The plurality of protrusions and the plurality of recesses may contact the planarization layer.

Each of the plurality of protrusions and each of the plurality of recesses may have a cylindrical shape or a polygonal column shape.

A dimension of each of the plurality of protrusions and a dimension of each of the plurality of recesses may be less than a wavelength of the visible light.

A diameter of each of the plurality of recesses may be less than or equal to 250 nm.

A difference between a diameter of each of the plurality of protrusions and the diameter of each of the plurality of recesses may be less than or equal to 100 nm.

A height of each of the plurality of protrusions and a depth of each of the plurality of recesses may be less than or equal to 100 nm.

The first electrode may be a transparent electrode, and the second electrode may be a semi-transmissive electrode configured to reflect a portion of light and transmit a remaining portion of the light.

The second electrode may include a reflective metal, and a thickness of the second electrode may be 10 nm to 20 nm.

The planarization layer may include a material that is transparent to the visible light, and a plurality of light absorbers may be dispersed in the planarization layer.

The visible light may be white light, the light of the first wavelength may include red light or green light, and the light of the second wavelength may include blue light.

The organic emission layer may include a hole injection layer disposed on the first electrode, an organic emission material layer disposed on the hole injection layer, and an electron injection layer disposed on the organic emission material layer.

According to another aspect of an example embodiment, there is provide a display apparatus including a first pixel configured to emit light of a first wavelength, and a second pixel configured to emit light of a second wavelength different from the first wavelength, the first pixel including a reflective layer including a phase modulation surface, a planarization layer disposed on the reflective layer, a first electrode disposed on the planarization layer, an organic emission layer disposed on the first electrode and configured to emit visible light that includes the light of the first wavelength and the light of the second wavelength that is shorter than the first wavelength, and a second electrode disposed on the organic emission layer, wherein the reflective layer and the second electrode form a micro cavity configured to resonate the light of the first wavelength, and wherein the planarization layer includes a light absorber configured to absorb the light of the second wavelength.

The phase modulating surface of the reflective layer may include a plurality of protrusions that are periodically two-dimensionally formed, and a resonance wavelength of the micro cavity may be determined by a width or a diameter of each of the plurality of protrusions, a height of each of the plurality of protrusions, and distances between the plurality of protrusions.

When the first wavelength is $\lambda$, a width or a diameter of each of the plurality of protrusions, a height of each of the plurality of protrusions, and distances between the plurality of protrusions may be set such that an optical length of the micro cavity is equal to $n\lambda/2$, where n is a natural number.

The phase modulating surface of the reflective layer may further include a plurality of recesses that are periodically two-dimensionally formed.

The plurality of recesses may be configured to absorb the light of the second wavelength.

The plurality of protrusions and the plurality of recesses may contact the planarization layer.

A dimension of each of the plurality of protrusions and a dimension of each of the plurality of recesses may be less than a wavelength of the visible light.

The second pixel may include a reflective layer including a flat surface, a planarization layer disposed on the reflective layer of the second pixel, a first electrode disposed on the planarization layer of the second pixel, an organic emission layer disposed on the first electrode of the second pixel and configured to emit the visible light that includes the light of the first wavelength and the light of the second wavelength, and a second electrode disposed on the organic emission layer of the second pixel, wherein the reflective layer of the second pixel and the second electrode of the second pixel form a micro cavity configured to resonate the light of the second wavelength.

The planarization layer of the second pixel may not include the light absorber configured to absorb the light of the second wavelength.

The planarization layer of the second pixel may include the light absorber configured to absorb the light of the second wavelength.

The reflective layer of the first pixel and the reflective layer of the second pixel may extend continuously.

The planarization layer of the first pixel and the planarization layer of the second pixel may extend continuously.

A physical thickness of the first pixel and a physical thickness of the second pixel may be same.

The visible light may be white light, the light of the first wavelength may include red light or green light, and the light of the second wavelength may include blue light.

The display apparatus may further include a third pixel configured to emit light of a third wavelength different from the first wavelength and the second wavelength, respectively, the third pixel may include a reflective layer including a phase modulation surface, a planarization layer disposed on the reflective layer of the third pixel, a first electrode disposed on the planarization layer of the third pixel, an organic emission layer disposed on the first electrode of the third pixel and configured to emit the visible light that includes the light of the first wavelength, the light of the second wavelength, and the light of the third wavelength, and a second electrode disposed on the organic emission layer of the third pixel, wherein the reflective layer of the third pixel and the second electrode of the third pixel form a micro cavity configured to resonate the light of the third wavelength.

The planarization layer of the third pixel may include the light absorber configured to absorb the light of the second wavelength that is shorter than the third wavelength.

The light absorber of the first pixel and the light absorber of the third pixel may include different materials.

A physical thickness of the first pixel, a physical thickness of the second pixel, and a physical thickness of the third pixel may be same.

The visible light may be white light, the light of the first wavelength may include red light, the light of the second wavelength may include blue light, and the light of the third wavelength may include green light.

According to an aspect of an example embodiment, there is provide a light emitting device including a reflective layer including a phase modulation surface, the phase modulation surface including a plurality of protrusions and a plurality of recesses, a planarization layer disposed on the reflective layer, a first electrode disposed on the planarization layer, an organic emission layer disposed on the first electrode and configured to emit visible light that includes light of a first wavelength and light of a second wavelength that is shorter than the first wavelength, and a second electrode disposed on the organic emission layer, wherein the reflective layer and the second electrode form a micro cavity configured to resonate the light of the first wavelength, and wherein the planarization layer includes a light absorber configured to absorb the light of the second wavelength.

A resonance wavelength of the micro cavity may be determined based on a width or a diameter of each of the plurality of protrusions, a height of each of the plurality of protrusions, and distances between the plurality of protrusions, and the plurality of recesses may be configured to absorb the light of the second wavelength

BRIEF DESCRIPTION OF THE DRAWINGS

The above and/or other aspects, features, and advantages of example embodiments of the disclosure will be more apparent from the following description taken in conjunction with the accompanying drawings, in which:

FIG. 23 is a cross-sectional view schematically showing a structure of a display apparatus according to another example embodiment.

DETAILED DESCRIPTION

Figure 1:
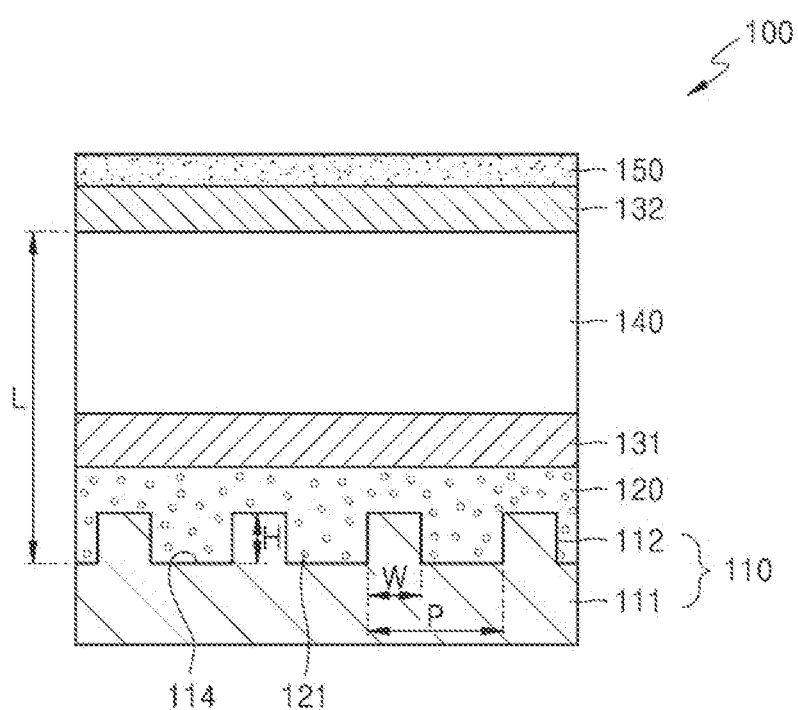
FIG. 1 is a cross-sectional view schematically showing a structure of a light emitting device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, with reference to the accompanying drawings, a light emitting device and a display apparatus including the light emitting device will be described in detail. Like reference numerals refer to like elements throughout, and in the drawings, sizes of elements may be exaggerated for clarity and convenience of explanation. The example embodiments described below are merely exemplary, and various modifications may be possible from the example embodiments.

In a layer structure described below, an expression "above" or "on" may include not only "immediately on in a contact manner" but also "on in a non-contact manner". An expression used in the singular encompasses the expression of the plural, unless it has a clearly different meaning in the context. It will be further understood that the terms "comprises" and/or "comprising" used herein specify the presence of stated features or elements, but do not preclude the presence or addition of one or more other features or elements.

The use of "the" and other demonstratives similar thereto may correspond to both a singular form and a plural form. Unless the order of operations of a method according to the present disclosure is explicitly mentioned or described otherwise, the operations may be performed in a proper order. The present disclosure is not limited to the order the operations are mentioned.

The term used in the example embodiments such as "unit" or "module" indicates a unit for processing at least one function or operation, and may be implemented in hardware or software, or in a combination of hardware and software.

The connecting lines, or connectors shown in the various figures presented are intended to represent functional relationships and/or physical or logical couplings between the various elements. It should be noted that many alternative or additional functional relationships, physical connections or logical connections may be present in a practical device.

The use of any and all examples, or language provided herein, is intended merely to better illuminate the disclosure and does not pose a limitation on the scope of the disclosure unless otherwise claimed.

FIG. 1 is a cross-sectional view schematically showing a structure of a light emitting device 100 according to an example embodiment. Referring to FIG. 1, the light emitting device 100 according to an example embodiment may include a reflective layer 110 having a phase modulation surface, a transparent planarization layer 120 disposed on the reflective layer 110, a first electrode 131 disposed on the planarization layer 120, an organic emission layer 140 disposed on the first electrode 131, and a second electrode 132 disposed on the organic emission layer 140. The light emitting device 100 may further include a transparent passivation layer 150 disposed on the second electrode 132 to protect the second electrode 132.

Figure 2:
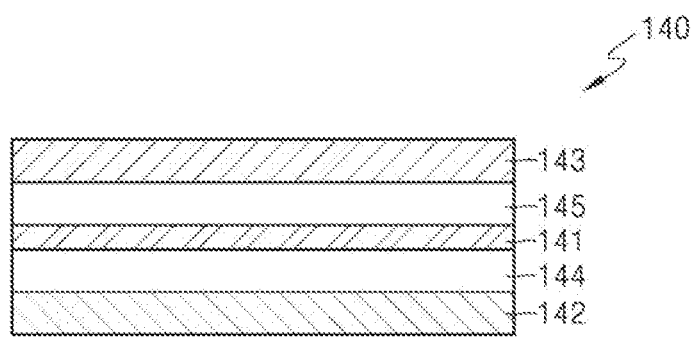
FIG. 2 is a cross-sectional view showing in more detail an example structure of an organic emission layer illustrated in FIG. 1.

The light emitting device 100 may be an organic light emitting diode (OLED). For example, FIG. 2 is a cross-sectional view showing an example structure of the organic emission layer 140 illustrated in FIG. 1 in more detail. Referring to FIG. 2, the organic emission layer 140 may include a hole injection layer 142 disposed on the planarization layer 120, an organic emission material layer 141 disposed on the hole injection layer 142, and an electron injection layer 143 disposed on the organic emission material layer 141. In this structure, holes provided through the hole injection layer 142 and electrons provided through the electron injection layer 143 may be combined in the organic emission material layer 141 to generate light. A wavelength of the generated light may be determined according to an energy band gap of a light emitting material of the organic emission material layer 141.

In addition, the organic emission layer 140 may further include a hole transfer layer 144 disposed between the hole injection layer 142 and the organic emission material layer 141 in order to further facilitate the transport of holes. In addition, the organic emission layer 140 may further include an electron transfer layer 145 disposed between the electron injection layer 143 and the organic emission material layer 141 in order to further facilitate the transport of electrons. In addition, the organic emission layer 140 may include various additional layers as necessary. For example, the organic emission layer 140 may further include an electron block layer between the hole transfer layer 144 and the organic emission material layer 141, and may also further include a hole block layer between the organic emission material layer 141 and the electron transfer layer 145.

The organic emission material layer 141 may be configured to emit visible light. For example, the organic emission material layer 141 may be configured to emit light in a wavelength band among a wavelength band of red light, a wavelength band of green light, and a wavelength band of blue light. However, embodiments are not limited thereto. For example, the organic emission material layer 141 may be configured to emit white visible light including all of red light, green light, and blue light.

Figure 3:
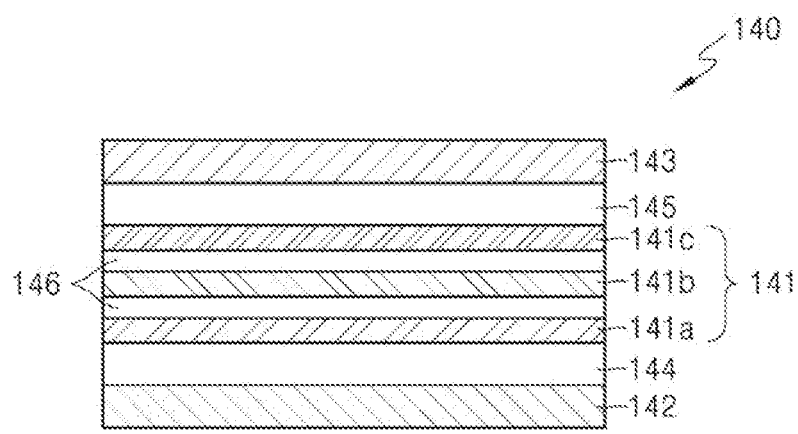
FIG. 3 is a cross-sectional view showing in more detail another example structure of an organic emission layer illustrated in FIG. 1.

For example, FIG. 3 is a cross-sectional view showing another example structure of the organic emission layer 140 illustrated in FIG. 1 in more detail. Referring to FIG. 3, the organic emission material layer 141 may include a first organic emission material layer 141a that emits red light, a second organic emission material layer 141b that emits green light, and a third organic emission material layer 141c that emits blue light. Further, an exciton blocking layer 146 may be disposed between the first organic emission material layer 141a and the second organic emission material layer 141b and between the second organic emission material layer 141b and the third organic emission material layer 141c. Then, the organic emission layer 140 may emit white light. However, the structure of the organic emission layer 140 that emits white light is not limited thereto. For example, the organic emission layer 140 may include two organic emission material layers in complementary relation to each other.

The first electrode 131 disposed on the lower surface of the organic emission layer 140 may serve as an anode that provides holes. The second electrode 132 disposed on the upper surface of the organic emission layer 140 may serve as a cathode that provides electrons. To this end, the first electrode 131 may include a material having a relatively high work function, and the second electrode 132 may include a material having a relatively low work function.

In addition, the first electrode 131 may be a transparent electrode having a property of transmitting light, for example, visible light. For example, the first electrode 131 may include transparent conductive oxide, such as indium tin oxide (ITO), indium zinc oxide (IZO), or aluminum zinc oxide (AZO).

The second electrode 132 may be a semi-transmissive electrode that reflects a portion of light and transmits the remaining portion of light. To this end, the second electrode 132 may include a very thin reflective metal. For example, the second electrode 132 may be a mixed layer of silver (Ag) and magnesium (Mg) or a mixed layer of aluminum (Al) and lithium (Li). The entire thickness of the second electrode 132 may be about 10 nm to about 20 nm. Because the thickness of the second electrode 132 is very thin, a portion of light may pass through the reflective metal.

The reflective layer 110 may be configured to reflect light generated from the organic emission layer 140 and transmitted through the first electrode 131. To this end, the reflective layer 110 may include silver (Ag), gold (Au), aluminum (Al), or an alloy including silver (Ag), gold (Au), and aluminum (Al). However, the reflective layer 110 is not limited thereto, and may include other reflective materials.

The reflective layer 110 may serves to configure a micro cavity L together with the second electrode 132. For example, the micro cavity L may be formed between the reflective layer 110 and the second electrode 132 of the light emitting device 100. For example, light generated from the organic emission layer 140 may reciprocate and resonate between the reflective layer 110 and the second electrode 132, and then light corresponding to the resonance wavelength of the micro cavity L may be emitted to the outside through the second electrode 132.

The resonance wavelength of the micro cavity L formed between the reflective layer 110 and the second electrode 132 may be determined by the optical length of the micro cavity L. For example, when the resonance wavelength of the micro cavity L is $\lambda$, the optical length of the micro cavity L may be $n\lambda/2$, where n is a natural number. The optical length of the micro cavity L may be determined as the sum of the optical thickness of layers forming the micro cavity L between the reflective layer 110 and the second electrode 132, a phase delay by the second electrode 132, and a phase shift, for example, a phase delay by the reflective layer 110. Here, the optical thickness of the layers forming the micro cavity L between the reflective layer 110 and the second electrode 132 is not a simple physical thickness, but is the thickness considering the refractive index of materials of the layers forming the micro cavity L. For example, the optical thickness of the layers forming the micro cavity L may be the sum of the optical thickness of the planarization layer 120, the optical thickness of the first electrode 131, and the optical thickness of the organic emission layer 140.

According to the example embodiment, the optical length of or the resonance wavelength of the micro cavity L may be adjusted by adjusting only the phase shift by the reflective layer 110 while fixing the optical thickness of the layers forming the micro cavity L and the phase delay by the second electrode 132. In order to control the phase shift by the reflective layer 110, a phase modulation surface may be formed on the reflective surface of the reflective layer 110 in contact with the planarization layer 120. The phase modulation surface may include very small patterns in the nanoscale. For example, the phase modulation surface of the reflective layer 110 may have a meta structure in which nano patterns having a size smaller than the wavelength of visible light are periodically disposed.

Referring back to FIG. 1, the reflective layer 110 may include a base 111 and the phase modulation surface formed on an upper surface 114 of the base 111. The phase modulation surface of the reflective layer 110 may include a plurality of protrusions 112 periodically formed on the upper surface 114 of the base 111. The plurality of protrusions 112 may have a post shape protruding from the upper surface 114 of the base 111. For example, the plurality of protrusions 112 may have a cylindrical shape. The plurality of protrusions 112 may be integrally formed with the base 111. The reflective layer 110 may be disposed such that the plurality of protrusions 112 is in contact with the planarization layer 120.

When each of the protrusions 112 is, for example, a cylinder, the optical characteristics of the phase modulation surface, for example, the phase delay of reflected light may be determined by a diameter W of each of the protrusions 112, a height H each of the protrusions 112 and a pitch or period P of the plurality of protrusions 112. When each of the protrusions 112 is a polygonal column, the optical characteristics of the phase modulation surface may be determined by a maximum width W of each of the protrusions 112, the height H of each of the protrusions 112, and the pitch or the period P of the plurality of protrusions 112.

The diameter W, the height H, and the period P of the protrusions 112 may be constant with respect to the entire region of the phase modulation surface. For example, the diameter W of the protrusion 112 may be from about 30 nm to about 250 nm, the height H of the protrusion 112 may be from about 0 nm to about 150 nm, and the period P of the plurality of protrusions 112 may be from about 100 nm to about 300 nm.

When the size of each of the protrusions 112 of the phase modulation surface is smaller than the resonance wavelength as described above, a plurality of nano-light resonance structures may be formed while incident light resonates in the periphery of the protrusions 112. In particular, in the incident light, an electric field component may not penetrate into a space between the protrusions 112, and only a magnetic field component may resonate in the periphery of the protrusions 112. Accordingly, the plurality of nano-light resonant structures formed in the space between the protrusions 112 may be a cylinder type magnetic resonator in which the magnetic field component of the incident light resonates in the periphery of the protrusions 112. As a result, a phase shift greater than a simple phase shift due to an effective optical distance (H×n) determined by the product of the height H of the protrusions 112 and a refractive index n of the protrusions 112 may occur on the phase modulation surface of the reflective layer 110.

Accordingly, the resonance wavelength of the micro cavity L may be determined by the diameter W of each of the protrusions 112 of the phase modulation surface, the height H of each of the protrusions 112 and the period P of the plurality of protrusions 112. For example, when the resonance wavelength of the micro cavity L is $\lambda$, the diameter W of each of the protrusions 112 of the phase modulation surface, the height H of each of the protrusions 112 and the period P of the plurality of protrusions 112 of the phase modulation surface may be selected such that the optical length of the micro cavity L satisfies $n\lambda/2$, where n is a natural number. Then, the resonance wavelength of the micro cavity L in the light emitting device 100 may more easily match with the emitting wavelength or emitting color of the light emitting device 100. For example, when the light emitting device 100 is a red light emitting device, the diameter W of each of the protrusions 112 of the phase modulation surface, the height H of each of the protrusions 112 and the period P of the plurality of protrusions 112 of the phase modulation surface may be selected such that the resonance wavelength of the micro cavity L corresponds to a red wavelength band. As described above, it may be possible to determine the emitting wavelength of the light emitting device 100 only by the structure of the phase modulation surface of the reflective layer 110.

Figure 4:
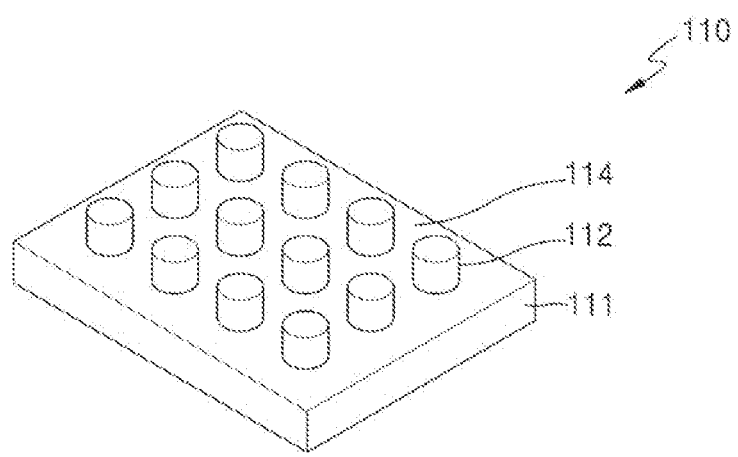
FIG. 4 is a perspective view schematically showing an example structure of a reflective layer illustrated in FIG. 1.
Figure 5:
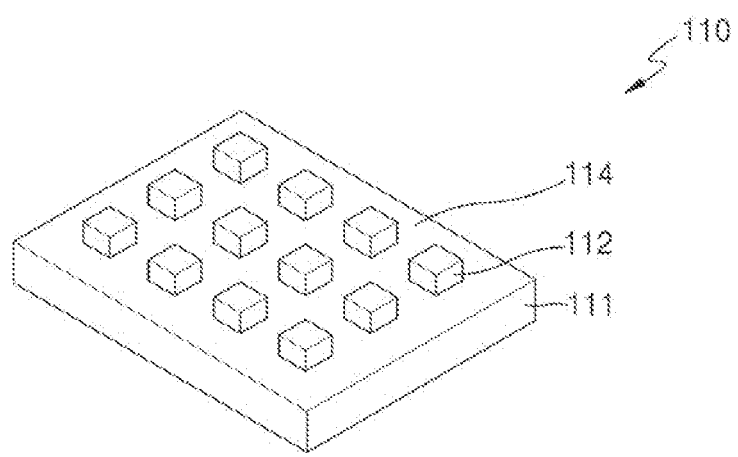
FIG. 5 is a perspective view schematically showing another example structure of a reflective layer illustrated in FIG. 1.

In order to prevent the micro cavity L from having a polarization dependency, the plurality of protrusions 112 may be regularly and periodically arranged to have a 4-fold symmetry characteristic. When the micro cavity L has the polarization dependency, only light of a specific polarization component may resonate, which may deteriorate the light emitting efficiency of the light emitting device 100. For example, FIG. 4 is a perspective view schematically showing an example structure of the reflective layer 110 illustrated in FIG. 1, and FIG. 5 is a perspective view schematically showing another example structure of the reflective layer 110 illustrated in FIG. 1. Referring to FIG. 4, the plurality of protrusions 112 having a cylindrical shape on the upper surface 114 of the base 111 may be regularly arranged two-dimensionally. In addition, referring to FIG. 5, the plurality of protrusions 112 having a square column shape may be regularly arranged two-dimensionally on the upper surface 114 of the base 111. In FIGS. 4 and 5, although the protrusion 112 has the cylindrical shape and the square column shape, the shape of the protrusion 112 is not necessarily limited thereto. For example, the protrusion 112 may have an elliptical column or a polygonal column shape of a pentagonal shape or more.

In addition, in FIGS. 4 and 5, the plurality of protrusions 112 is arranged in a regular two-dimensional array pattern. In this case, intervals between the two adjacent protrusions 112 in the entire region of a phase modulation surface may be constant. However, if the plurality of protrusions 112 has a 4-fold symmetry characteristic, the plurality of protrusions 112 may be arranged in any other type of array. For example, the plurality of protrusions 112 may be arranged irregularly. In this case, the micro cavity L may not have a polarization dependency. Meanwhile, in another example embodiment, the arrangement of the plurality of protrusions 112 may be designed differently from the 4-fold symmetry such that the light emitting device 100 intentionally emits only light of a specific polarization component. For example, the plurality of protrusions 112 may be arranged in a one-dimensional array pattern.

The planarization layer 120 may be disposed on the reflective layer 110 having the phase modulation surface including the plurality of protrusions 112 to provide a flat surface. The lower surface of the planarization layer 120 may have a shape complementary to the phase modulation surface of the reflective layer 110, and the upper surface thereof has a flat shape. Therefore, the first electrode 131 disposed on the upper surface of the planarization layer 120 may have a flat lower surface. Then, the first electrode 131 may apply a uniform electric field to the organic emission layer 140. The planarization layer 120 may include a material transparent to visible light. In addition, the planarization layer 120 may include an insulating material to prevent current from flowing from the first electrode 131 to the reflective layer 110. For example, the planarization layer 120 may include metal oxide such as silicon dioxide ($SiO_2$), silicon nitride (SiNx), aluminum oxide ($Al_2O_3$), or hafnium dioxide ($HfO_2$), metal nitride, or a transparent polymer compound.

Meanwhile, when considering the physical thickness of the organic emission layer 140, the optical length of the micro cavity L may be selected to mainly use a second resonance. In other words, the optical length of the micro cavity L may be selected to be the same as the emitting wavelength $\lambda$ of the light emitting device 100, where n=2 in $n\lambda/2$. In this case, a portion of light having a wavelength shorter than the emitting wavelength of the light emitting device 100 may generate a third resonance, where n=3, and may be emitted from the light emitting device 100. For example, when the light emitting device 100 is configured to emit red light, the optical length of the micro cavity L may be selected as 630 nm. In this case, part of light having a wavelength of 420 nm may generate the third resonance and may be emitted from the light emitting device 100. Then, since blue light is emitted from the light emitting device 100 together with red light, the color purity of light emitted from the light emitting device 100 may be reduced.

According to the example embodiment, in order to suppress the light having the wavelength shorter than the emitting wavelength of the light emitting device 100 from being emitted from the light emitting device 100, the planarization layer 120 may include a light absorber 121 that absorbs light in a wavelength band shorter than the emitting wavelength of the light emitting device 100. The light absorber 121 may be selected, for example, to absorb light in a wavelength band that causes the third resonance within the micro cavity L of the light emitting device 100. Then, the light in the wavelength band causing the second resonance in the micro cavity L may not be absorbed by the light absorber 121 but may be emitted from the light emitting device 100. Meanwhile, the light in the wavelength band causing the third resonance in the micro cavity L may be absorbed by the light absorber 121 in the planarization layer 120 in a process of repeatedly passing through the planarization layer 120.

In FIG. 1, a plurality of light absorbers 121 is uniformly dispersed inside the planarization layer 120. In the planarization layer 120, only the material of the light absorber 121 may be mixed and dispersed alone, but embodiments are not limited thereto. For example, the material of the light absorber 121 and an organic binder may be mixed and dissolved in an organic solvent, and then the organic solvent may be applied on the reflective layer 110 and cured by light or heat, and thus the planarization layer 120 may be formed.

Figure 6:
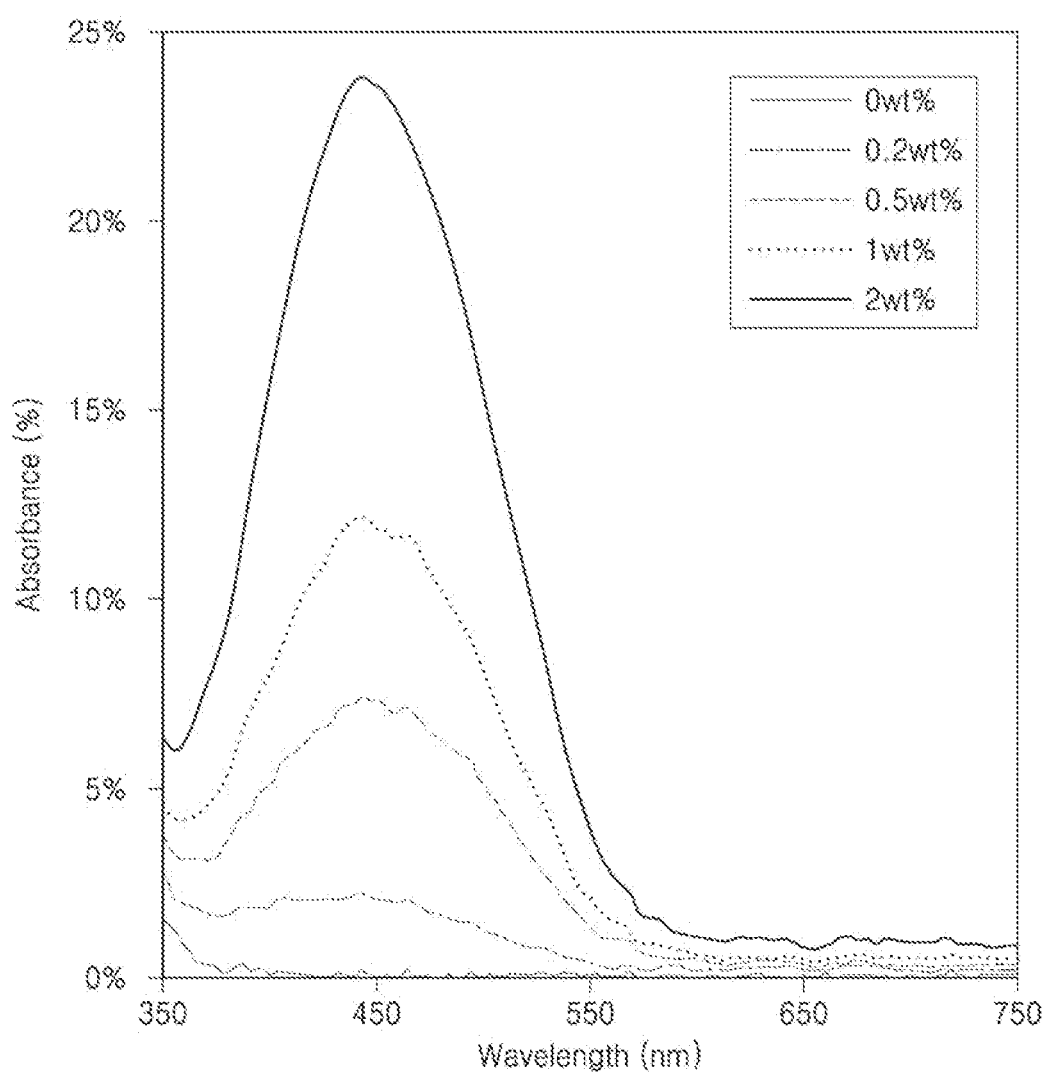
FIG. 6 is a graph showing an example of the absorption characteristics of a planarization layer including a light absorber.

For example, FIG. 6 is a graph showing an example of the absorption characteristics of the planarization layer 120 including the light absorber 121. In FIG. 6, a material that absorbs blue light is used as the light absorber 121, and a change in the absorption characteristics of the planarization layer 120 is measured while changing the concentration of the material of the light absorber 121 dissolved in an organic solvent. In the graph of FIG. 6, the concentration represents the concentration of the material of the light absorber 121 before curing the organic solvent, and an absorbance is measured after curing the organic solvent to form the planarization layer 120. Referring to the graph of FIG. 6, it may be seen that the planarization layer 120 has an absorption peak near a wavelength of about 450 nm and the absorbance increases as the material of the light absorber 121 increases.

Figure 7:
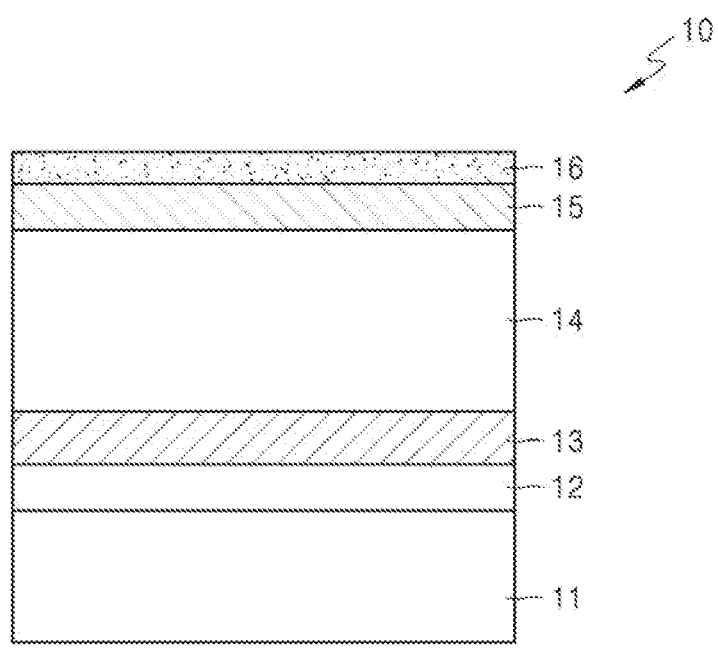
FIG. 7 is a cross-sectional view showing a structure of a light emitting device according to a first related example.

FIG. 7 is a cross-sectional view showing the structure of a light emitting device 10 according to a first related example. Referring to FIG. 7, the light emitting device 10 according to the first related example may include a reflective layer 11, a planarization layer 12, a first electrode 13, an organic emission layer 14, a second electrode 15 and a passivation layer 16. Compared to the light emitting device 100 according to the example embodiment, the light emitting device 10 is different in that the reflective layer 11 of the light emitting device 10 does not have a phase modulation surface and the planarization layer 12 does not include a light absorber.

Figure 8:
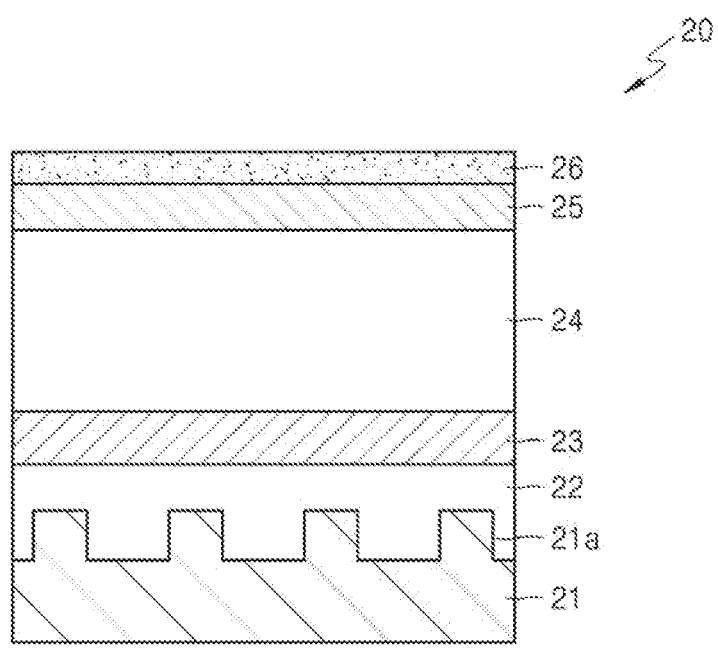
FIG. 8 is a cross-sectional view showing a structure of a light emitting device according to a second related example.

In addition, FIG. 8 is a cross-sectional view showing the structure of a light emitting device 20 according to a second related example. Referring to FIG. 8, the light emitting device 20 according to the second related example may include a reflective layer 21 having a phase modulation surface 21a, a planarization layer 22, a first electrode 23, an organic emission layer 24, a second electrode 25 and a passivation layer 26. Compared with the light emitting device 100 according to the example embodiment, the light emitting device 20 is different in that the planarization layer 22 of the light emitting device 20 does not include a light absorber.

Figure 9:
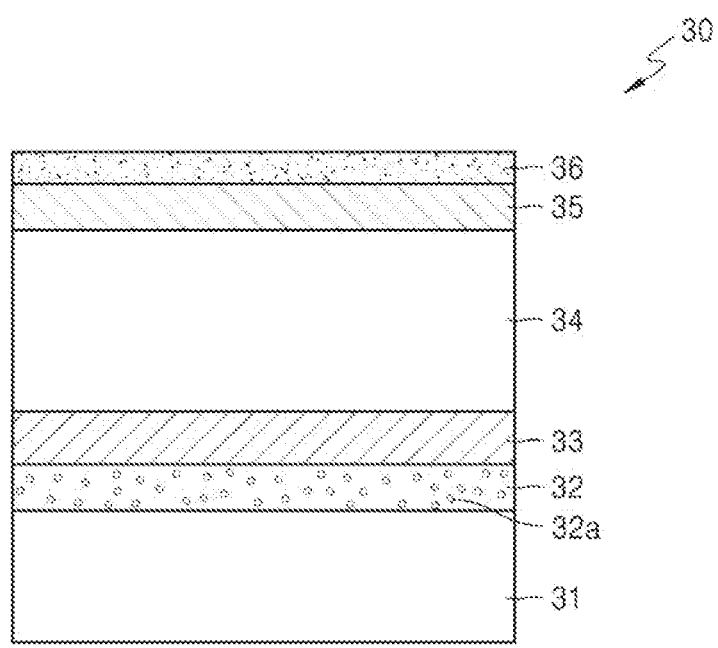
FIG. 9 is a cross-sectional view showing a structure of a light emitting device according to a third related example.

In addition, FIG. 9 is a cross-sectional view showing the structure of a light emitting device 30 according to a third related example. Referring to FIG. 9, the light emitting device 30 according to the third related example may include a reflective layer 31, a planarization layer 32 including a light absorber 32a, a first electrode 33, an organic emission layer 34, a second electrode 35 and a passivation layer 36. Compared to the light emitting device 100 according to the example embodiment, the light emitting device 30 is different in that the reflective layer 31 of the light emitting device 30 does not have a phase modulation surface.

Figure 10:
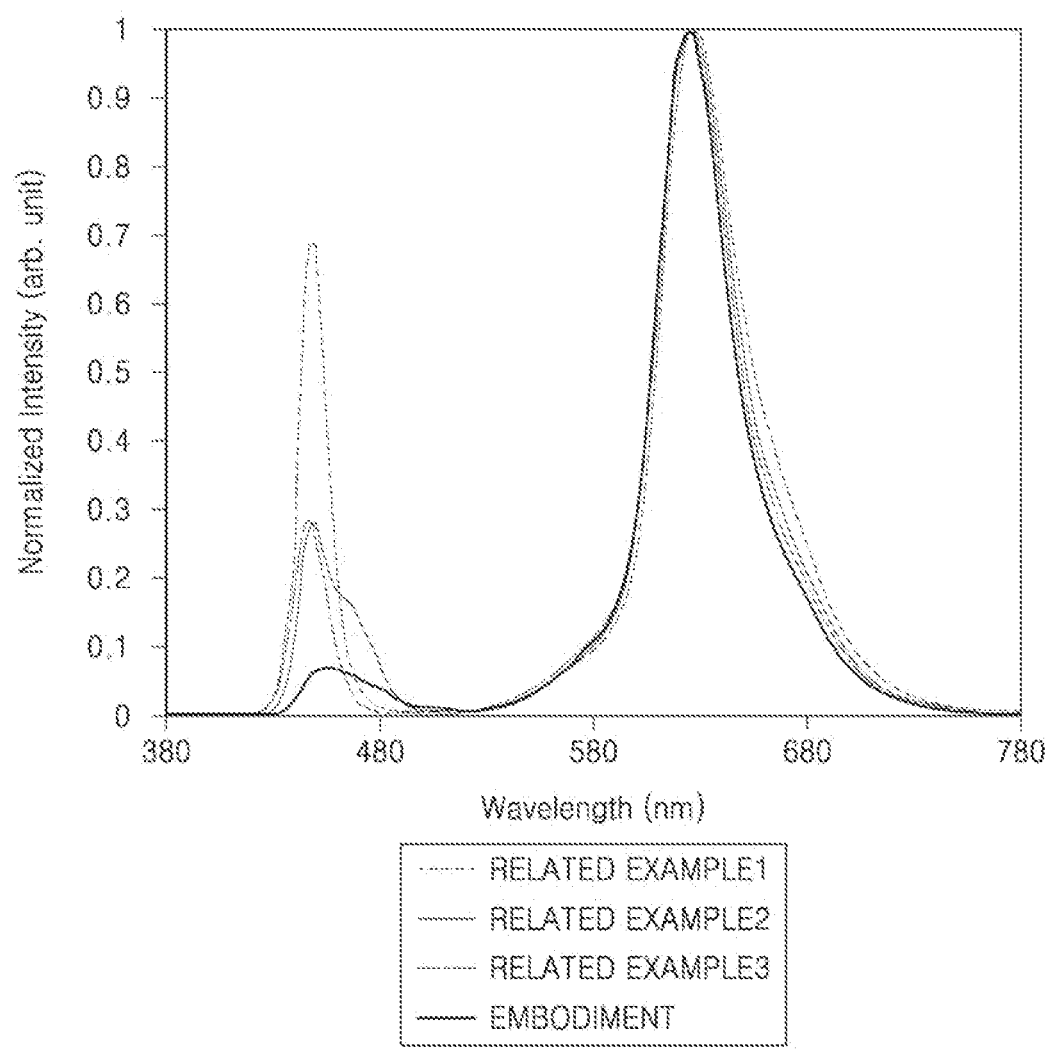
FIG. 10 is a graph showing comparisons of spectrums of light emitted from the light emitting devices according to the first to third related examples and the example embodiment.

FIG. 10 is a graph showing comparisons of spectrums of light emitted from the light emitting devices 10, 20, 30, and 100 according to the first to third related examples and the example embodiment. All of the light emitting devices 10, 20, 30, and 100 according to the first to third related examples and the example embodiment select optical lengths of micro cavities such that a second resonance occurs in a wavelength band of red light. The graph of FIG. 10 illustrates that the intensity of blue light emitted from the light emitting device 10 according to the first related example is the greatest. In addition, the intensity of blue light emitted from the light emitting devices 20 and 30 according to the second and third related examples are similar to each other. In the light emitting device 100 according to the example embodiment, the emission of blue light is greatly reduced.

Figure 11:
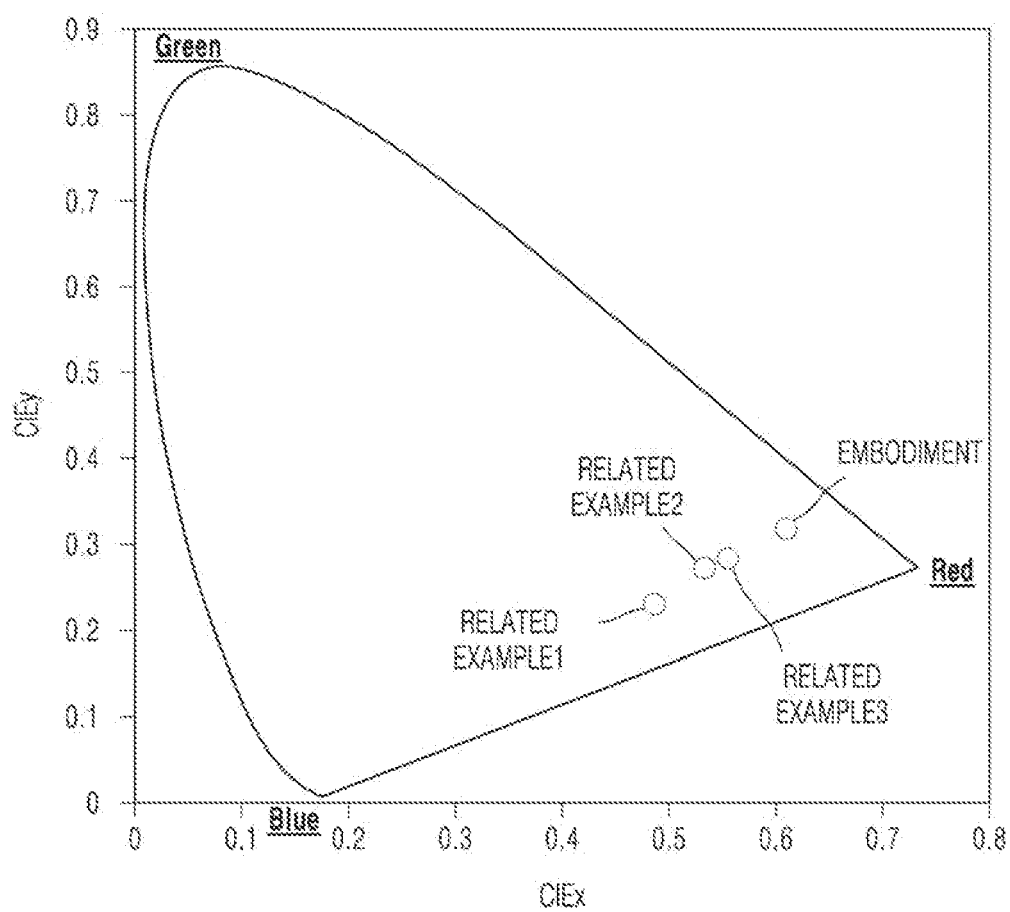
FIG. 11 shows comparisons of color coordinates of the light emitted from the light emitting devices according to the first to third related examples and the example embodiment.

In addition, FIG. 11 shows comparisons of color coordinates of light emitted from the light emitting devices 10, 20, 30, and 100 according to the first to third related examples and the example embodiment. The color coordinates shown in FIG. 11 are CIE 1934 color coordinates. FIG. 11 illustrates that light emitted from the light emitting device 100 according to the example embodiment is closest to pure red light. Then, the color purity of the emitted light deteriorates as the color of the emitted light is gradually closer to blue light in the order of the third related example, the second related example, and the first related example.

As described above, according to the example embodiment, the light emitting device 100 including a micro cavity may more easily match a resonance wavelength of the micro-cavity to the emitting wavelength of the light emitting device 100 by appropriately configuring a phase modulation surface. In addition, because the planarization layer 120 disposed on the phase modulation surface includes a light absorber that absorbs light that is not a target light emitting wavelength component, for example, light of another wavelength component that causes a third resonance in the micro cavity, the light emitting device 100 may emit only light of the target emitting wavelength component and suppress light of the remaining wavelength components. Therefore, the light emitting device 100 may achieve higher color purity.

Figure 12:
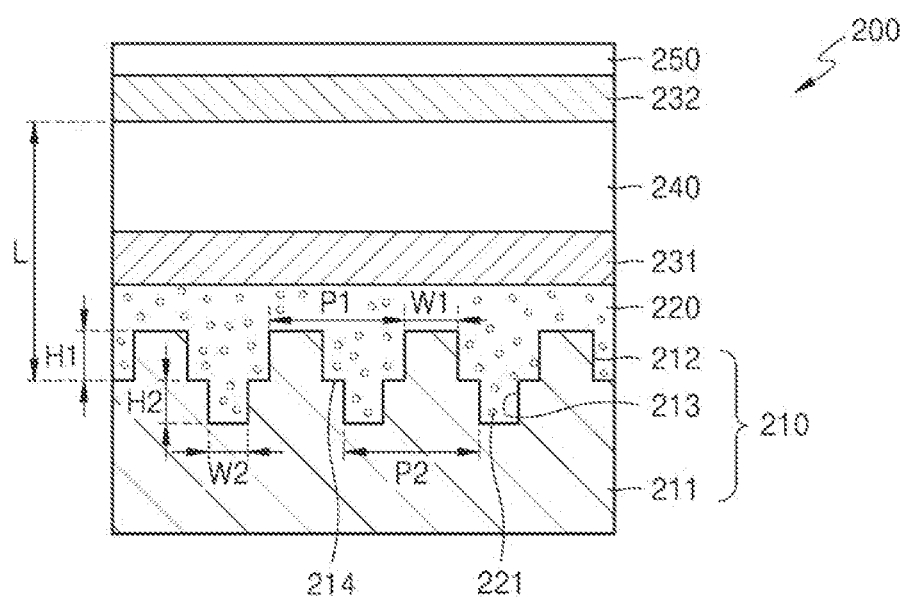
FIG. 12 is a cross-sectional view schematically showing a structure of a light emitting device according to another example embodiment.

FIG. 12 is a cross-sectional view schematically showing a structure of a light emitting device 200 according to another example embodiment. Referring to FIG. 12, the light emitting device 200 according to another example embodiment may include a reflective layer 210 including a phase modulation surface, a planarization layer 220 disposed on the reflective layer 210 and including a light absorber 221, a first electrode 231 disposed on the planarization layer 220, an organic emission layer 240 disposed on the first electrode 231, and a second electrode 232 disposed on the organic emission layer 240. In addition, the light emitting device 200 may further include a transparent passivation layer 250 disposed on the second electrode 232. Compared with the light emitting device 100 shown in FIG. 1, the structure of the phase modulation surface formed on the reflective layer 210 of the light emitting device 200 shown in FIG. 12 is different from the structure of a phase modulation surface of the light emitting device 100 shown in FIG. 1. The remaining configuration of the light emitting device 200 illustrated in FIG. 12 is the same as that of the light emitting device 100 illustrated in FIG. 1, and thus descriptions thereof will be omitted.

Figure 13:
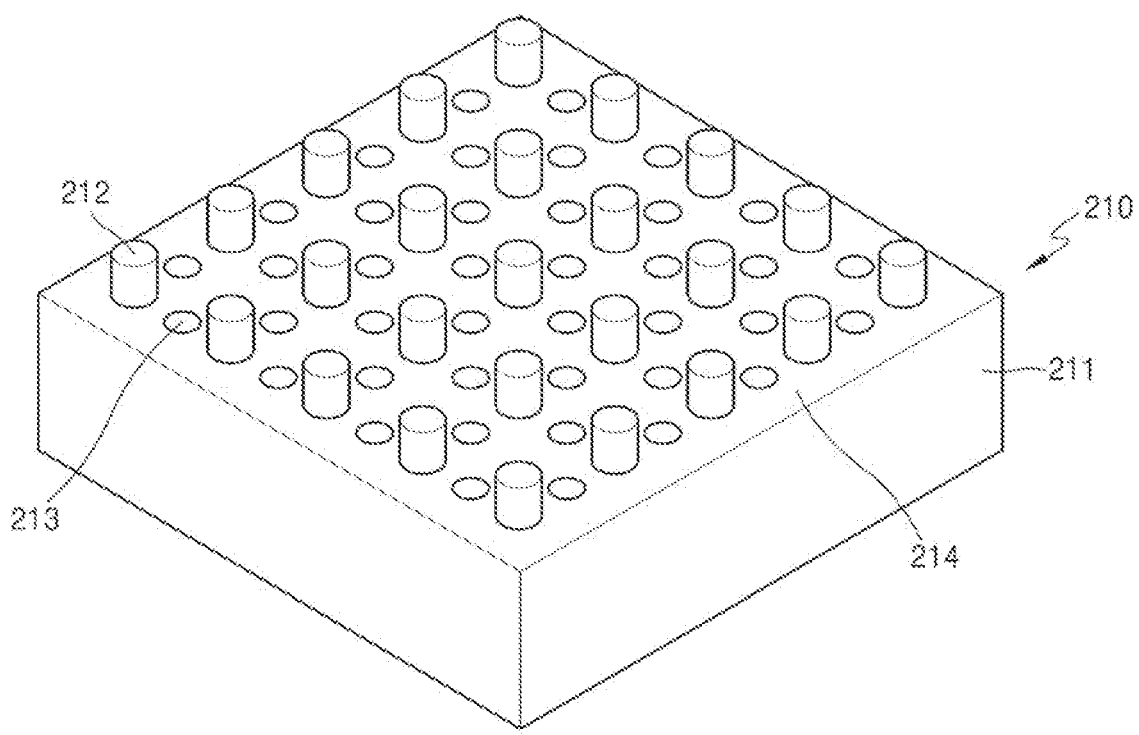
FIG. 13 is a perspective view schematically showing an example structure of a reflective layer illustrated in FIG. 12.
Figure 14:
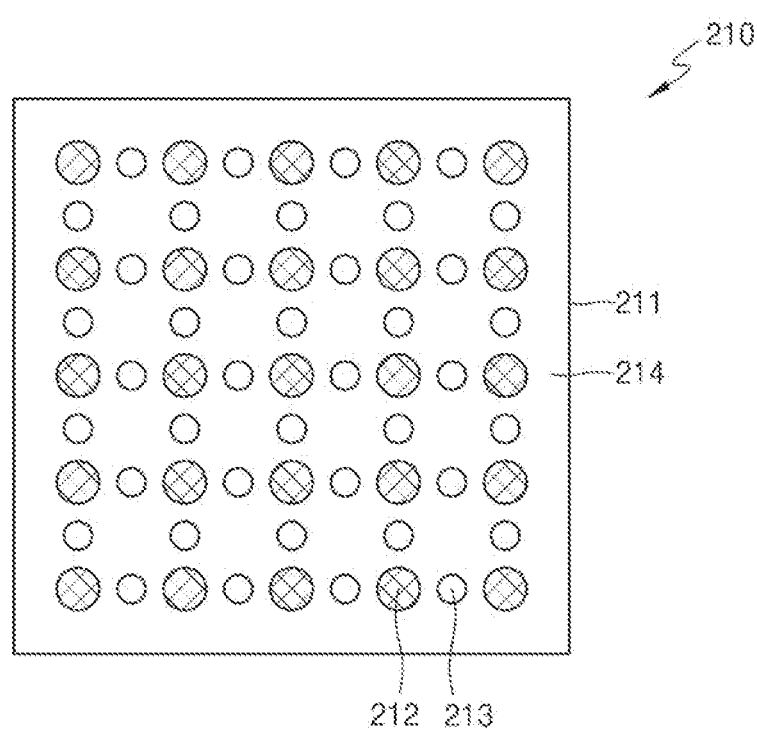
FIG. 14 is a plan view schematically showing an example structure of the reflective layer illustrated in FIG. 12.

FIG. 13 is a perspective view schematically showing an example structure of the reflective layer 210 illustrated in FIG. 12, and FIG. 14 is a plan view schematically showing an example structure of the reflective layer 210 illustrated in FIG. 12. Referring to FIGS. 12 to 14, the phase modulation surface may include a plurality of protrusions 212 and a plurality of recesses 213 periodically disposed on an upper surface 214 of a base 211 facing the first electrode 231. The reflective layer 210 may be disposed such that the plurality of protrusions 212 and the plurality of recesses 213 are in contact with the planarization layer 220.

Each of the protrusions 212 protruding from the upper surface 214 of the base 211 and each of the recesses 213 recessed from the upper surface 214 of the base 211 may have dimensions smaller than the wavelength of visible light. As shown in FIGS. 13 and 14, the protrusions 212 and the recesses 213 may be formed to be spaced apart, and an area occupied by the upper surface 214 may be greater than an area occupied by the plurality of protrusions 212 or the plurality of recesses 213. In addition, the area occupied by each of the protrusions 212 may be greater than or equal to the area occupied by each of the recesses 213.

The plurality of protrusions 212 may be periodically arranged with a predetermined pitch P1 on the upper surface 214 of the base 211. FIG. 14 shows an example of the protrusions 212 periodically arranged in the shape of a square array. However, this is merely an example, and in addition, the plurality of protrusions 212 may be arranged in an array of various other shapes such as a regular triangle, a regular hexagon, etc. Each of the protrusions 212 may have, for example, a diameter W1 of approximately 300 nm or less. However, each of the protrusions 212 is not necessarily limited thereto. For example, each of the protrusions 212 may have the diameter W1 of approximately 30 nm to 250 nm. Further, each of the protrusions 212 may have, for example, a height H1 of approximately 100 nm or less. However, these numerical values are only examples.

As described above, the plurality of protrusions 212 may serve to adjust the optical length of the micro cavity L to resonate light corresponding to the emitting wavelength of the light emitting device 200. For example, when the resonance wavelength of the micro cavity L is $\lambda$, the diameter W1 and the height H1 of each of the protrusions 212 of the phase modulation surface and the pitch P1 of the protrusions 212 may be selected such that the optical length of the micro cavity L satisfies $n\lambda/2$, where n is a natural number.

The plurality of recesses 213 may be formed at a predetermined depth H2 on the upper surface 214 of the base 211. The plurality of recesses 213 may be periodically two-dimensionally arranged with a predetermined pitch P2 between the plurality of protrusions 212. FIGS. 13 and 14 show examples of each of the recesses 213 disposed between the two adjacent protrusions 212. Each of the recesses 213 may be formed in a cylindrical shape. Each of the recesses 213 may have, for example, a diameter W2 of approximately 250 nm or less. More specifically, for example, each of the recesses 213 may have a diameter W2 of approximately 80 nm to 250 nm, but is not limited thereto. Further, each of the recesses 213 may have, for example, a depth H2 of approximately 100 nm or less but this is merely an example. In addition, a difference between the diameter W1 of each of the protrusions 212 and the diameter W2 of each of the recesses 213 may be, for example, approximately 100 nm or less, but is not limited thereto.

Figure 15A:
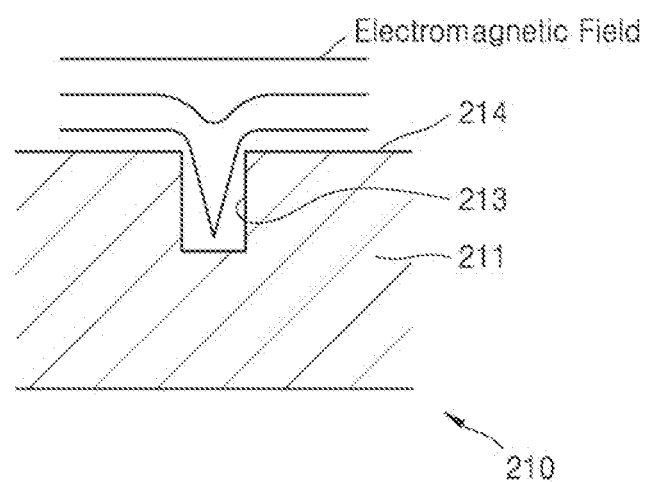
FIG. 15A schematically shows light of a short wavelength flowing into a recess formed in a reflective layer.
Figure 15B:
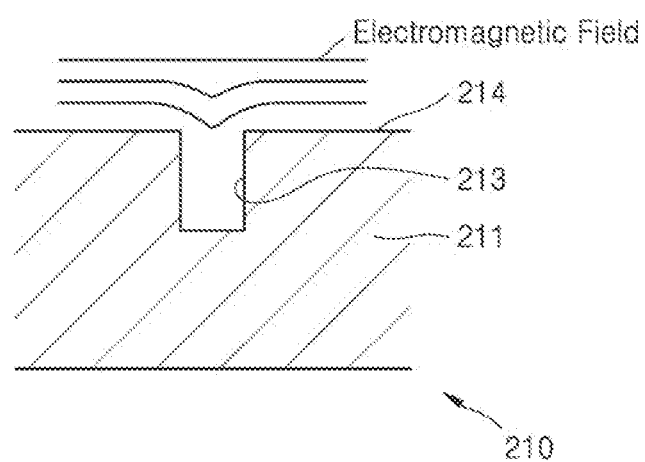
FIG. 15B schematically shows light of a long wavelength blocked in the reflective layer in which the recess is formed.

The plurality of the recesses 213 may serve to absorb light of a wavelength of which resonance is not desired within the micro cavity L. FIG. 15A schematically shows light of a short wavelength flowing into the recess 213 formed in the reflective layer 210, and FIG. 15B schematically shows light of a long wavelength blocked in the reflective layer 210 in which the recess 213 is formed. As shown in FIG. 15A, the light of the short wavelength flows into and is absorbed in the nano-sized recess 213 formed in the upper surface 214 of the base 211, whereas, as shown in FIG. 15B, the light of the long wavelength does not flow into the recess 213 and is reflected from the upper surface 214 of the base 211.

The wavelength of the light absorbed into the recess 213 formed in the reflective layer 210 may vary according to the size of the recess 213. For example, when the protrusions 212 are not considered, the recess 213 having a diameter of approximately 190 nm formed on the surface of the flat reflective layer 210 including silver (Ag) may absorb blue light of a wavelength of 450 nm, and the recess 213 having a diameter of approximately 244 nm may absorb green light of a wavelength of 550 nm.

As described above, in the light emitting device 200 configured to emit red light, when the optical length of the micro cavity L is selected as 630 nm, a portion of light of a wavelength of 420 nm may cause a third resonance to be emitted from the light emitting device 200. Then, because blue light is emitted from the light emitting device 200 together with red light, the color purity of light emitted from the light emitting device 200 may be reduced. In the example embodiment, light of a wavelength of which resonance is not desired may be absorbed by the light absorber 221 in the planarization layer 220. In addition, the light of the wavelength of which resonance is not desired may be additionally absorbed by the recess 213 by forming the plurality of nano-sized recesses 213 along with the plurality of protrusions 212 on the phase modulation surface of the reflective layer 210. Therefore, the color purity of the light emitting device 200 may be further improved.

Figure 16:
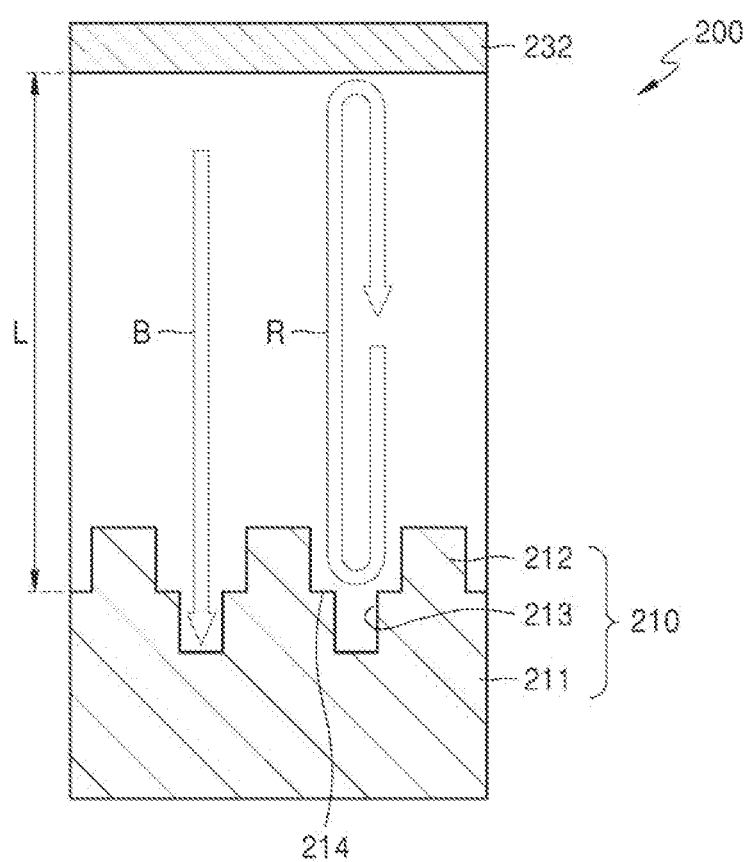
FIG. 16 schematically shows light resonating in a light emitting device according to the example embodiment.

FIG. 16 schematically shows light resonating in the light emitting device 200 according to the example embodiment. In FIG. 16, a red light emitting device is illustrated as the light emitting device 200 as an example, and for convenience, only the reflective layer 210 and the second electrode 232 constituting the micro cavity L are illustrated. Referring to FIG. 16, in the micro cavity L, a red light R may not flow into the recess 213 formed in the surface of the reflective layer 210 but may be reflected from the surface of the reflective layer 210. However, it may be seen that a blue light B having a wavelength shorter than the red light R flows into and is absorbed in the recess 213 formed in the surface of the reflective layer 210. As described above, each of the recesses 213 may have, for example, a diameter of approximately 250 nm or less. Accordingly, in the micro cavity L, only the red light R may resonate and be emitted outside the light emitting device 200.

According to an example embodiment, the light emitting device 200 may be a green light emitting device. In general, in a case where the surface of a reflective layer has a flat structure, when a second resonance of a green light occurs in a micro cavity, a third resonance of an ultraviolet light occurs, which does not affect a display apparatus in a visible light region. However, when the reflective layer 210 having the phase modulation surface is used, there is a possibility that a third resonance of the blue light B occurs in the micro cavity L due to the phase modulation. In addition, because the optical length varies according to the refractive index and thickness of the planarization layer 220, the resonance wavelength may change. Accordingly, blue light B of an undesired short wavelength in the green light emitting device may be emitted. Therefore, even when the light emitting device 200 is the green light emitting device, the undesired emission of the blue light B may be further suppressed by forming the plurality of recesses 213 in the surface of the reflective layer 210 and dispersing the light absorber 221 in the planarization layer 220.

As described above, by forming the plurality of recesses 213 in the phase modulation surface of the reflective layer 210 and dispersing the light absorber 221 in the planarization layer 220, light having a long wavelength of which resonance is desired, for example, red light or green light, may resonate and be emitted, and light of a short wavelength, for example, blue light of which resonance is not desired may be absorbed, and thus color purity may be further improved.

Figure 17:
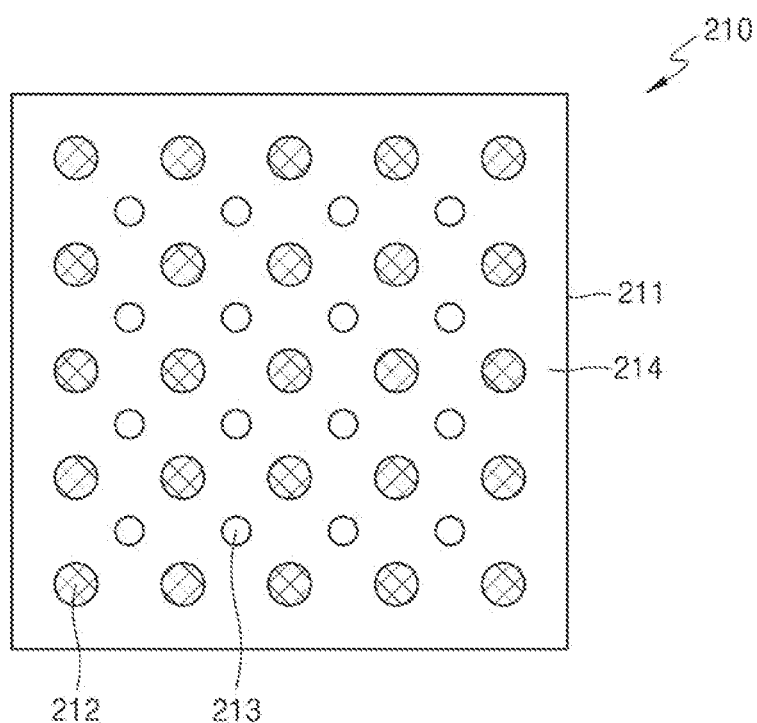
FIG. 17 is a plan view schematically showing another example structure of the reflective layer shown in FIG. 12.

FIG. 17 is a plan view schematically showing another example structure of the reflective layer 210 shown in FIG. 12. In the example embodiment shown in FIGS. 13 and 14, the protrusions 212 are periodically arranged in a square array, and each of the recesses 213 may be formed between the two adjacent protrusions 212. In the reflective layer 210 shown in FIG. 17, the protrusions 212 protruding from the upper surface 214 of the base 211 may be periodically arranged in the square array, and the recesses 213 may be arranged between the two protrusions 212 arranged adjacent to each other in a diagonal direction on the upper surface 214 of the base 211 at a predetermined depth. In other words, each of the recesses 213 may be disposed in the center of a unit array of a square shape including the four adjacent protrusions 212. However, this is merely an example, and the protrusions 212 and the recesses 213 may be arranged in various other shapes.

Figure 18:
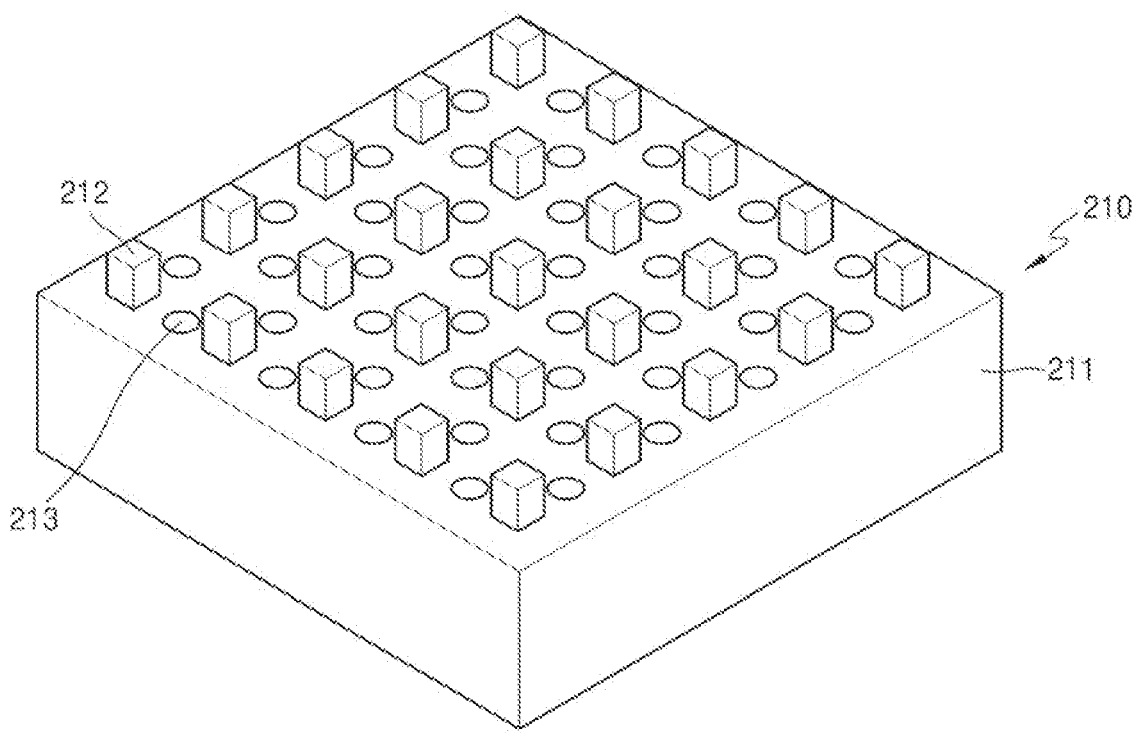
FIG. 18 is a perspective view schematically showing another example structure of the reflective layer shown in FIG. 12.

In addition, FIG. 18 is a perspective view schematically showing another example structure of the reflective layer 210 shown in FIG. 12. In the example embodiment shown in FIGS. 13 and 14, the protrusions 212 have a cylindrical shape and the recesses 213 are formed in a cylindrical shape. In the metal reflective layer 210 shown in FIG. 18, the protrusions 212 have a square column shape. In this case, the maximum width of the protrusion 212 may correspond to the diameter. In addition, the recesses 213 may be formed in the cylindrical shape between the two adjacent protrusions 212. However, this is merely an example, and each of the protrusions 212 may have a variety of other polyprism shapes, such as a triangular column or a pentagonal column. In addition, each of the recesses 213 may also be formed in various other shape.

Figure 19:
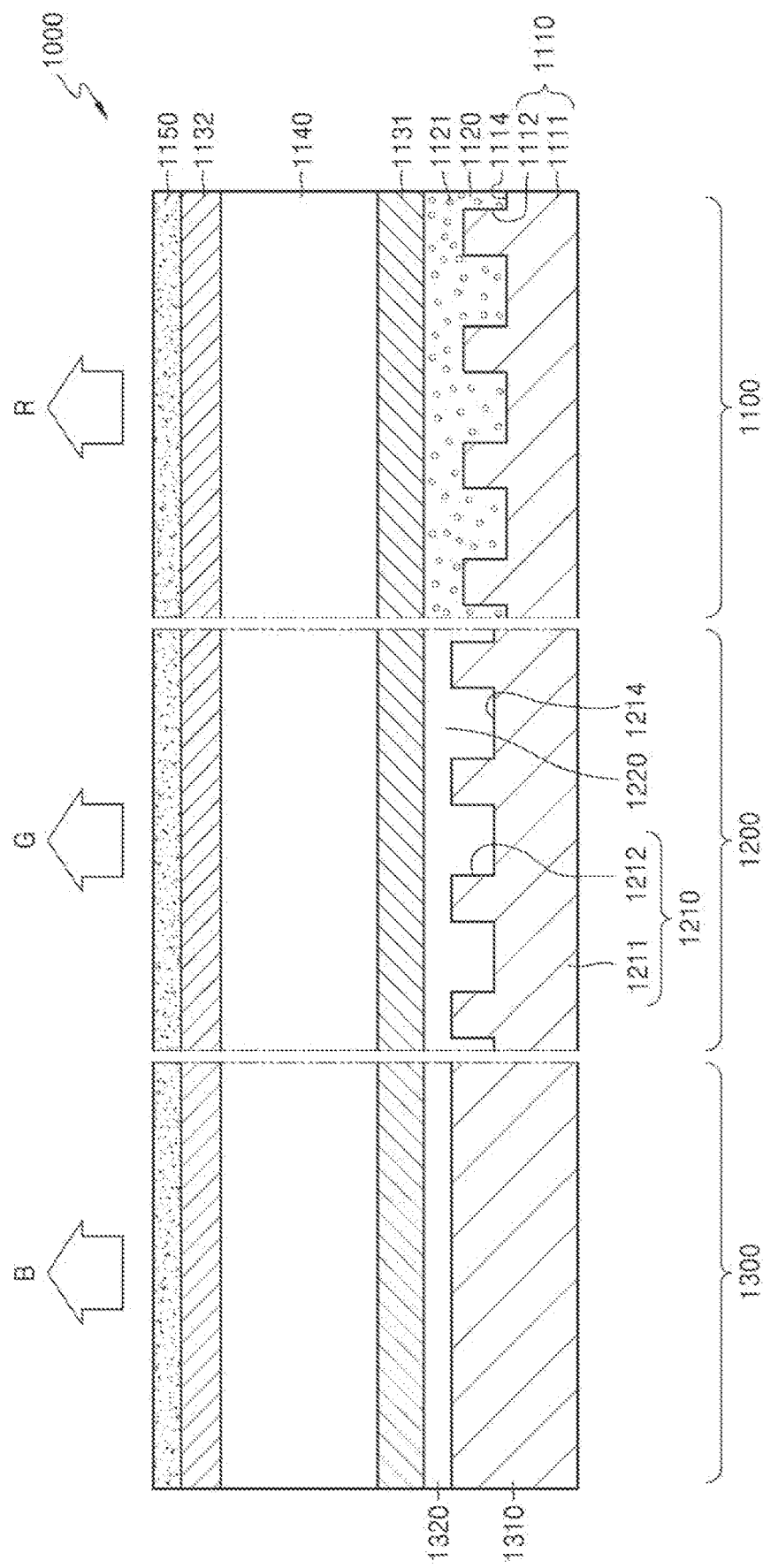
FIG. 19 is a cross-sectional view schematically showing a structure of a display apparatus according to an example embodiment.

The above-described light emitting devices 100 and 200 may be applied to a plurality of pixels of a display apparatus. FIG. 19 is a cross-sectional view schematically showing a structure of a display apparatus 1000 according to an example embodiment. Referring to FIG. 19, the display apparatus 1000 may include a plurality of pixels that emit light of different colors. Here, the plurality of pixels may include a red pixel 1100, a green pixel 1200, and a blue pixel 1300 disposed adjacent to each other on the same plane of a substrate. For example, only one unit pixel including the red pixel 1100, the green pixel 1200, and the blue pixel is illustrated for convenience.

The red pixel 1100 may have the same structure as the light emitting device 100 illustrated in FIG. 1. The red pixel 1100 may include a first reflective layer 1110 including a first phase modulation surface, a first planarization layer 1120 disposed on the first reflective layer 1110, a first electrode 1131 disposed on the first planarization layer 1120, an organic emission layer 1140 disposed on the first electrode 1131, and a second electrode 1132 disposed on the organic emission layer 1140. The red pixel 1100 may further include a transparent passivation layer 1150 disposed on the second electrode 1132. The first reflective layer 1110 may include a plurality of first protrusions 1112 formed to protrude on an upper surface 1114 of a base 1111. The first reflective layer 1110 may form a first micro cavity that resonates the red light R together with the second electrode 1132. Also, the first planarization layer 1120 may include a light absorber 1121 that absorbs blue light B.

The green pixel 1200 may have the same structure as the light emitting device 100 shown in FIG. 1. The green pixel 1200 may include a second reflective layer 1210 including a second phase modulation surface, a second planarization layer 1220 disposed on the second reflective layer 1210, the first electrode 1131 disposed on the second planarization layer 1220, the organic emission layer 1140 disposed on the first electrode 1131, the second electrode 1132 disposed on the organic emission layer 1140, and the passivation layer 1150 disposed on the second electrode 1132. The second reflective layer 1210 may include a plurality of second protrusions 1212 formed to protrude over an upper surface 1214 of a base 1211. The second reflective layer 1210 may form a second micro cavity that resonates the green light G together with the second electrode 1132. In the case of the green pixel 1200, the second planarization layer 1220 may not include a light absorber.

In addition, the blue pixel 1300 may include a third reflective layer 1310, a third planarization layer 1320 disposed on the third reflective layer 1310, a first electrode 1131 disposed on the third planarization layer 1320, the organic emission layer 1140 disposed on the first electrode 1131, the second electrode 1132 disposed on the organic emission layer 1140, and the passivation layer 1150 disposed on the second electrode 1132. The upper surface of the third reflective layer 1310 in the blue pixel 1300 may include a flat reflective surface. Also, the third planarization layer 1320 may not include a light absorber.

The third reflective layer 1310 may form a third micro cavity that resonates blue light B together with the second electrode 1132. The third micro cavity may have a resonance wavelength of the blue light B by adjusting structural and optical characteristics of the layers disposed between the third reflective layer 1310 and the second electrode 1132. Here, the upper surface of the third reflective layer 1310 may be formed at the same height as the upper surfaces of the first protrusions 1112 of the first phase modulation surface and the second protrusions 1212 of the second phase modulation surface. The third reflective layer 1310 may have a third phase modulation surface having a resonance wavelength of the blue light B. In this case, the third phase modulation surface may include a plurality of protrusions that protrude at a predetermined height on the upper surface of the third reflective layer 1310.

In the display apparatus 1000 according to the example embodiment having the above structure, the first reflective layer 1110, the second reflective layer 1210, and the third reflective layer 1310 of the red pixel 1100, the green pixel 1200, and the blue pixel 1300 adjacent to each other may continuously extend. Also, the first planarization layer 1120, the second planarization layer 1220, and the third planarization layer 1320 may also continuously extend to each other. Also, the first electrodes 1131 of the red pixel 1100, the green pixel 1200, and the blue pixel 1300 may integrally extend. For example, the first electrode 1131 may be a common electrode. For independent driving of the red pixel

1100, the green pixel 1200, and the blue pixel disposed adjacent to each other, the organic emission layers 1140 and the second electrodes 1132 of the red pixel 1100, the green pixel 1200, and the blue pixel 1300 may be separated from each other. For example, the second electrode 1132 may be a pixel electrode. In addition, the red pixel 1100, the green pixel 1200, and the blue pixel 1300 may include the same organic emission layer 1140. In this case, the organic emission layer 1140 may be configured to emit white light.

In the red pixel 1100, in the white light generated in the organic emission layer 1140, the red light R may reciprocate and resonate between the first reflective layer 1110 and the second electrode 1132, and then may be emitted to the outside through the second electrode 1132. At this time, in the white light generated in the organic emission layer 1140, the blue light B may be absorbed by the light absorber 1121 in the first planarization layer 1120, and thus the red light R with improved color purity may be emitted in the red pixel 1100.

In the green pixel 1200, in the white light generated from the organic emission layer 1140, the green light G may reciprocate and resonate between the second reflective layer 1210 and the second electrode 1132 and then may be emitted to the outside through the second electrode 1132. In addition, in the blue pixel 1300, in the white light generated in the organic emission layer 1140, the blue light B may reciprocate and resonate between the third reflective layer 1310 and the second electrode 1132, and then may be emitted to the outside through the second electrode 1132.

According to the example embodiment, the red pixel 1100 and the green pixel 1200 may respectively include the plurality of first protrusions 1112 and the plurality of second protrusions 1212 that have the first phase modulation surface and the second phase modulation surface having the sizes smaller than the wavelength of incident light and periodically disposed, and may more easily induce resonance of a desired wavelength by adjusting the sizes and pitches of the first protrusions 1112 and the second protrusions 1212. Accordingly, in order to adjust the optical length of a micro cavity of each of the red pixel 1100, the green pixel 1200, and the blue pixel 1300, the physical thickness of each of the red pixel 1100, the green pixel 1200, and the blue pixel 1300 may not need to be individually adjusted, and only the first phase modulation surface of the red pixel 1100 and the second phase modulation surface of the green pixel 1200 may be individually configured. Then, the physical thicknesses of the red pixel 1100, the green pixel 1200, and the blue pixel 1300 may all be the same. In addition, the upper surfaces of the first protrusions 1112 and the second protrusions 1212 in the red pixel 1100 and the green pixel 1200 may be formed to have the same height as the upper surfaces of the third reflective layer 1310 in the blue pixel 1300. Thus, the display apparatus 1000 may be manufactured more easily. In addition, the light absorber 1121 in the first planarization layer 1120 of the red pixel 1100 may absorb the blue light B, and thus the color purity of the red light R emitted from the red pixel 1100 may be improved.

Figure 20:
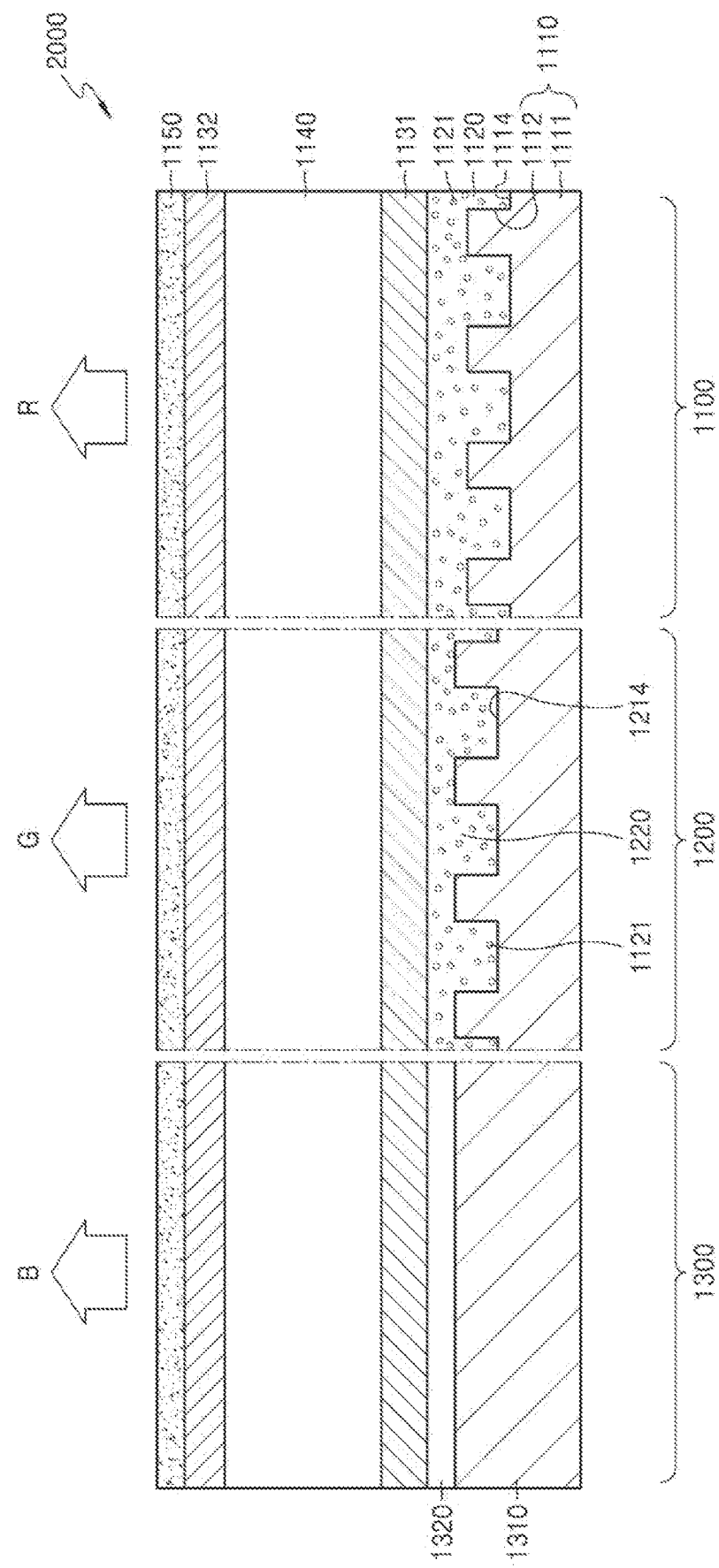
FIG. 20 is a cross-sectional view schematically showing a structure of a display apparatus according to another embodiment.

FIG. 20 is a cross-sectional view schematically showing a structure of a display apparatus 2000 according to another example embodiment. In the case of the display apparatus 2000 illustrated in FIG. 20, the second planarization layer 1220 of the green pixel 1200 may further include the light absorber 1121 that absorbs the blue light B. Then, the color purity of the green light G emitted from the green pixel 1200 may be improved. Here, the light absorber 1121 disposed on the first planarization layer 1120 of the red pixel 1200 and the light absorber 1121 disposed on the second planarization layer 1220 of the green pixel 1200 may include the same material or different materials. For example, the light absorber 1121 disposed on the first planarization layer 1120 of the red pixel 1100 may be selected as a material that does not absorb the red light R, and the light absorber 1121 disposed on the second planarization layer 1220 of the green pixel 1200 may be selected as a material that does not absorb the green light G.

Figure 21:
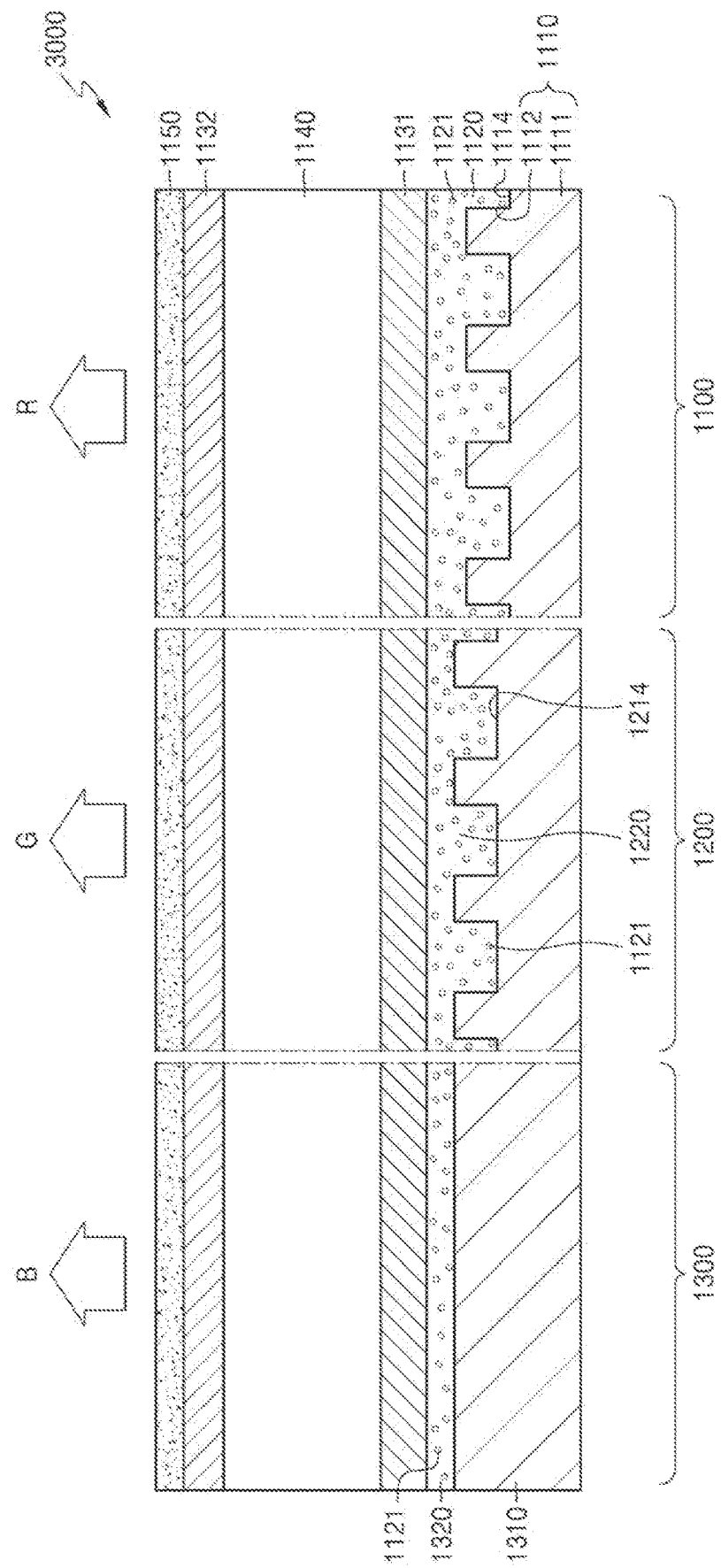
FIG. 21 is a cross-sectional view schematically showing a structure of a display apparatus according to another example embodiment.

In addition, FIG. 21 is a cross-sectional view schematically showing a structure of a display apparatus 3000 according to another example embodiment. In the display apparatus 3000 illustrated in FIG. 21, a planarization layer of all pixels may include the light absorber 1121 that absorbs the blue light B. In other words, the light absorbers 1121 of the same material that absorbs the blue light B may be dispersed in the first planarization layer 1120 of the red pixel 1100, the second planarization layer 1220 of the green pixel 1200, and the third planarization layer 1320 of the blue pixel 1300. Then, the first planarization layer 1120, the second planarization layer 1220, and the third planarization layer 1320 of the red pixel 1100, the green pixel 1200, and the blue pixel 1300 may be formed more simply in a single process.

As illustrated in FIG. 21, the distance between the upper surface of the third reflective layer 1310 and the lower surface of the first electrode 1131 may be the shortest in the blue pixel 1300. In the red pixel 1100, the distance between the upper surface 1114 of the base 1111 of the first reflective layer 1110 and the lower surface of the first electrode 1131 may be the longest. Therefore, in the third planarization layer 1320 of the blue pixel 1300, because a path through which the blue light B passes is the shortest, the loss of the blue light B due to the light absorber 1121 in the third planarization layer 1320 may be relatively small. In addition, in the first planarization layer 1120 of the red pixel 1100, because a path through which the blue light B passes is the longest, the blue light B may be sufficiently absorbed by the light absorber 1121 in the first planarization layer 1120.

Figure 22:
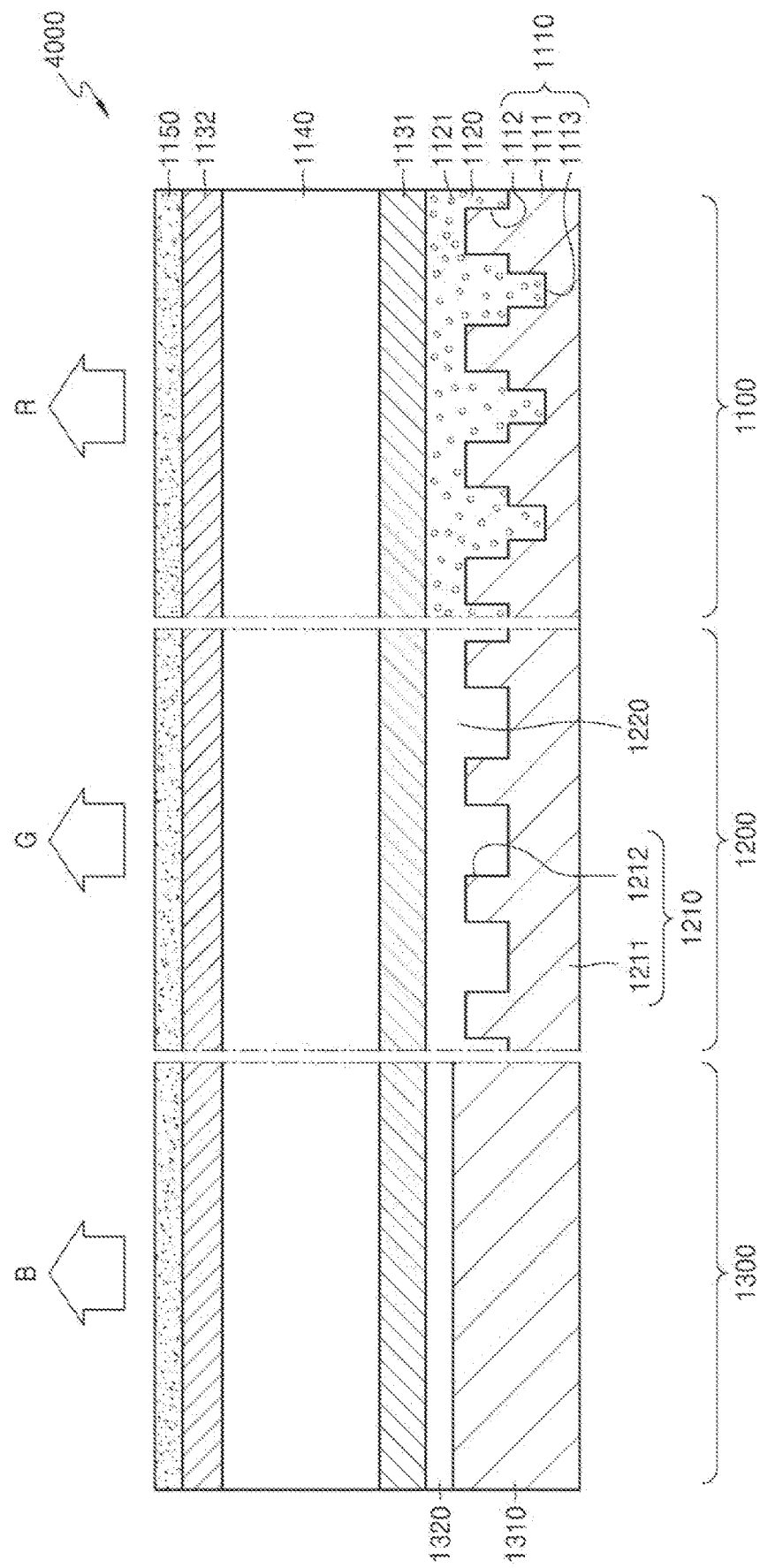
FIG. 22 is a cross-sectional view schematically showing a structure of a display apparatus according to another example embodiment.

FIG. 22 is a cross-sectional view schematically showing a structure of a display apparatus 4000 according to another example embodiment. Referring to FIG. 22, the first reflective layer 1110 of the red pixel 1100 of the display apparatus 4000 may further include a plurality of first recesses 1113 that absorb the blue light B. The second reflective layer 1210 of the green pixel 1200 may include only the second protrusion 1212. Accordingly, the first recess 1113 together with the light absorber 1121 in the red pixel 1100 may absorb the blue light B, and thus the color purity of the red light R emitted from the red pixel 1100 may be improved.

In addition, FIG. 23 is a cross-sectional view schematically showing a structure of a display apparatus 5000 according to another example embodiment. Referring to FIG. 23, the first reflective layer 1110 of the red pixel 1100 of the display apparatus 5000 may further include the plurality of first recesses 1113 that absorb the blue light B, and the second reflective layer 1210 of the green pixel 1200 may further include a plurality of second recesses 1213 that absorb the blue light B.

In FIGS. 22 and 23, only the red pixel 1100 includes the light absorber 1121, but is not limited thereto. For example, as in the example embodiment illustrated in FIG. 20, in the example embodiments of FIGS. 22 and 23, the red pixel 1100 and the green pixel 1200 may include the light absorber 1121. Also, as in the example embodiment illustrated in FIG. 21, in the example embodiments of FIGS. 22 and 23, the red pixel 1100, the green pixel 1200, and the blue pixel 1300 may all include the light absorber 1121.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A display apparatus comprising:
    a first pixel configured to emit light of a first wavelength; and
    a second pixel configured to emit light of a second wavelength different from the first wavelength,
    the first pixel comprises:
        a reflective layer comprising a phase modulation surface;
        a planarization layer disposed on the reflective layer;
        a first electrode disposed on the planarization layer;
        an organic emission layer disposed on the first electrode and configured to emit visible light that comprises the light of the first wavelength and the light of the second wavelength that is shorter than the first wavelength; and
        a second electrode disposed on the organic emission layer,
    wherein the reflective layer and the second electrode form a micro cavity configured to resonate the light of the first wavelength,
    wherein the planarization layer comprises a light absorber configured to absorb the light of the second wavelength,
    wherein the phase modulating surface of the reflective layer comprises a plurality of protrusions that are periodically two-dimensionally formed, and
    wherein a resonance wavelength of the micro cavity is determined by a width or a diameter of each of the plurality of protrusions, a height of each of the plurality of protrusions, and distances between the plurality of protrusions.

2. The display apparatus of claim 1, wherein, when the first wavelength is $\lambda$, a width or a diameter of each of the plurality of protrusions, a height of each of the plurality of protrusions, and distances between the plurality of protrusions are set such that an optical length of the micro cavity is equal to $n\lambda/2$, where n is a natural number.

3. The display apparatus of claim 1, wherein the phase modulating surface of the reflective layer further comprises a plurality of recesses that are periodically two-dimensionally formed.

4. The display apparatus of claim 3, wherein the plurality of recesses are configured to absorb the light of the second wavelength.

5. The display apparatus of claim 3, wherein the plurality of protrusions and the plurality of recesses contact the planarization layer.

6. The display apparatus of claim 3, wherein a dimension of each of the plurality of protrusions and a dimension of each of the plurality of recesses is less than a wavelength of the visible light.

7. The display apparatus of claim 1, wherein the second pixel comprises:
    the reflective layer comprising a flat surface;
    the planarization layer disposed on the reflective layer of the second pixel;
    the first electrode disposed on the planarization layer of the second pixel;
    the organic emission layer disposed on the first electrode of the second pixel and configured to emit the visible light that comprises the light of the first wavelength and the light of the second wavelength; and
    the second electrode disposed on the organic emission layer of the second pixel,
    wherein the reflective layer of the second pixel and the second electrode of the second pixel form a micro cavity configured to resonate the light of the second wavelength.

8. The display apparatus of claim 7, wherein the planarization layer of the second pixel does not comprise the light absorber configured to absorb the light of the second wavelength.

9. The display apparatus of claim 7, wherein the planarization layer of the second pixel comprises the light absorber configured to absorb the light of the second wavelength.

10. The display apparatus of claim 7, wherein the reflective layer of the first pixel and the reflective layer of the second pixel extend continuously.

11. The display apparatus of claim 7, wherein the planarization layer of the first pixel and the planarization layer of the second pixel extend continuously.

12. The display apparatus of claim 7, wherein a physical thickness of the first pixel and a physical thickness of the second pixel are same.

13. The display apparatus of claim 7, wherein the visible light is white light, the light of the first wavelength comprises red light or green light, and the light of the second wavelength comprises blue light.

14. The display apparatus of claim 1, further comprising:
    a third pixel configured to emit light of a third wavelength different from the first wavelength and the second wavelength, respectively,
    the third pixel comprises:
        the reflective layer comprising the phase modulation surface;
        the planarization layer disposed on the reflective layer of the third pixel;
        the first electrode disposed on the planarization layer of the third pixel;
        the organic emission layer disposed on the first electrode of the third pixel and configured to emit the visible light that comprises the light of the first wavelength, the light of the second wavelength, and the light of the third wavelength; and
        the second electrode disposed on the organic emission layer of the third pixel,
    wherein the reflective layer of the third pixel and the second electrode of the third pixel form a micro cavity configured to resonate the light of the third wavelength.

15. The display apparatus of claim 14, wherein the planarization layer of the third pixel comprises the light absorber configured to absorb the light of the second wavelength that is shorter than the third wavelength.

16. The display apparatus of claim 15, wherein the light absorber of the first pixel and the light absorber of the third pixel comprise different materials.

17. The display apparatus of claim 14, wherein a physical thickness of the first pixel, a physical thickness of the second pixel, and a physical thickness of the third pixel are same.

18. The display apparatus of claim 14, wherein the visible light is white light, the light of the first wavelength comprises red light, the light of the second wavelength comprises blue light, and the light of the third wavelength comprises green light.

\* \* \* \* \*